(12) United States Patent
Matsushita et al.

(10) Patent No.: US 7,816,215 B2
(45) Date of Patent: Oct. 19, 2010

(54) SEMICONDUCTOR DEVICE MANUFACTURING METHOD

(75) Inventors: Daisuke Matsushita, Kanagawa-Ken (JP); Koichi Muraoka, Kanagawa-Ken (JP); Seiji Inumiya, Kanagawa-Ken (JP); Koichi Kato, Kanagawa-Ken (JP); Kazuhiro Eguchi, Kanagawa-Ken (JP); Mariko Takayanagi, Kanagawa-Ken (JP); Yasushi Nakasaki, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/941,814

(22) Filed: Sep. 16, 2004

(65) Prior Publication Data

US 2005/0064667 A1    Mar. 24, 2005

(30) Foreign Application Priority Data

Sep. 19, 2003    (JP)    ............................... 2003-327660

(51) Int. Cl.
*H01L 21/336* (2006.01)
(52) U.S. Cl. ...................... 438/287; 438/591; 438/763; 257/E21.625; 257/E21.639
(58) Field of Classification Search ................. 438/287, 438/513, 591, 770, 775, 778, 786, 787, 792, 438/216, 197, 199, 261, 585, 587, 588, FOR. 177, 438/FOR. 193, FOR. 202, FOR. 494, 761–763, 438/765, 769, FOR. 203, FOR. 395, FOR. 489; 257/E21.625, E21.639, 288, 350, E29.015, 257/E21.19–E21.193, E21.409, E21.423, 257/E21.457
See application file for complete search history.

(56) References Cited

U.S. PATENT DOCUMENTS

| | | | | | |
|---|---|---|---|---|---|
| 4,621,277 | A | * | 11/1986 | Ito et al. | 257/313 |
| 5,304,829 | A | * | 4/1994 | Mori et al. | 257/324 |
| 5,504,021 | A | * | 4/1996 | Hong et al. | 438/763 |
| 6,015,739 | A | * | 1/2000 | Gardner et al. | 438/287 |
| 6,060,403 | A | * | 5/2000 | Yasuda et al. | 438/765 |

(Continued)

FOREIGN PATENT DOCUMENTS

JP    2000-208510    7/2000

(Continued)

OTHER PUBLICATIONS

Y. Yasuda et al., "Radical Nitridation in Multi-oxide Process for 100nm Generation CMOS Technology," 2001 Symposium on VLSI Technology Digest of Technical Papers (2001).

(Continued)

*Primary Examiner*—Matthew Smith
*Assistant Examiner*—Quovaunda Jefferson
(74) *Attorney, Agent, or Firm*—Finnegan, Henderson, Farabow, Garrett & Dunner, L.L.P.

(57) ABSTRACT

A semiconductor device manufacturing method comprises: forming a gate insulative film on a semiconductor substrate by: forming a first nitride film on the substrate; forming a first oxide film and a second oxide film, the first oxide film being between the substrate and the first nitride film, the second oxide film being on the first nitride film; and nitriding the second oxide film to form, on the first nitride film, one of either: a second nitride film or an SiON film; and forming a gate electrode on the gate insulative film; wherein the equivalent oxide thickness of the gate insulative film is equal to or less than 1 nm.

21 Claims, 19 Drawing Sheets

U.S. PATENT DOCUMENTS

| | | | | |
|---|---|---|---|---|
| 6,110,842 | A * | 8/2000 | Okuno et al. | 438/776 |
| 6,207,586 | B1 * | 3/2001 | Ma et al. | 438/763 |
| 6,225,169 | B1 * | 5/2001 | Chew et al. | 438/287 |
| 6,319,775 | B1 * | 11/2001 | Halliyal et al. | 438/261 |
| 6,323,143 | B1 * | 11/2001 | Yu | 438/791 |
| 6,479,349 | B1 * | 11/2002 | Oya et al. | 438/261 |
| 6,660,597 | B2 * | 12/2003 | Furukawa et al. | 438/287 |
| 6,667,251 | B2 * | 12/2003 | McFadden et al. | 438/795 |
| 6,727,134 | B1 * | 4/2004 | Chen et al. | 438/216 |
| 6,858,487 | B2 * | 2/2005 | Yang et al. | 438/231 |
| 2001/0035127 | A1 * | 11/2001 | Metzner et al. | 118/715 |
| 2001/0044187 | A1 * | 11/2001 | Joo et al. | 438/264 |
| 2002/0192881 | A1 * | 12/2002 | Ballantine et al. | 438/147 |
| 2002/0197883 | A1 * | 12/2002 | Niimi et al. | 438/775 |
| 2003/0001218 | A1 | 1/2003 | Takagi | |
| 2003/0116804 | A1 * | 6/2003 | Visokay et al. | 257/350 |
| 2003/0168706 | A1 | 9/2003 | Aoki et al. | |
| 2003/0170945 | A1 * | 9/2003 | Igeta et al. | 438/200 |
| 2003/0232507 | A1 * | 12/2003 | Chen | 438/763 |
| 2004/0058497 | A1 * | 3/2004 | Chen et al. | 438/287 |
| 2004/0082125 | A1 * | 4/2004 | Hou et al. | 438/240 |
| 2004/0132259 | A1 * | 7/2004 | Yang et al. | 438/305 |
| 2005/0112888 | A1 * | 5/2005 | Burnham et al. | 438/689 |

FOREIGN PATENT DOCUMENTS

| | | |
|---|---|---|
| JP | 2002-83960 | 3/2002 |
| JP | 2002-110674 | 4/2002 |

OTHER PUBLICATIONS

Notification of Reason for Rejection mailed Jul. 28, 2006, issued by the Japanese Patent Office in counterpart Japanese Application No. 2003-327660 and English translation thereof.

Matsushita et al., "Atomic-Scale Characterization of Nitridation Processes on Si(100)-2 x 1 Surfaces by Radical Nitrogen", Jpn. J. Appl. Phys., vol. 40, pp. 2827-2829, (2001).

Kundu et al., "N and Si Outdiffusion in HfAlO$_x$/SiN/Si(001) Structure During Thermal Annealing", JSAP Catalog No. AP042202, pp. 111-114, (Jan. 2004).

Sekine et al., "Semiconductor Device and Manufacturing Method Thereof", U.S. Appl. No. 10/785,074, filed Feb. 25, 2004.

\* cited by examiner

SEMICONDUCTOR DEVICE MANUFACTURING METHOD

CROSS-REFERENCE TO RELATED APPLICATION

This application is based upon and claims the benefit of priority from the prior Japanese Patent Application No. 2003-327660, filed on Sep. 19, 2003, the entire contents of which are incorporated herein by reference.

BACKGROUND OF THE INVENTION

1. Field of the Invention

The present invention relates to a semiconductor device manufacturing method.

2. Related Background Art

Recently, a high performance LSI is increasingly desired. A transistor is miniaturized for higher performance of LSI. Because of the miniaturization of the transistor, the channel length becomes shorter and the switching speed of the transistor is improved. This leads to improvement in signal processing speed of the transistor.

Accompanying such transistor miniaturization, a gate insulative film is required to be formed thinner. It is anticipated that a gate insulative film having a thickness of equal to or less than 1 nm is required in the future. In the case where a silicon oxide film is used as the gate insulative film, when the silicon oxide film is made thinner to equal to or less than 1 nm, direct tunnel current penetrating the film becomes dominant and the reliability of the gate insulative film becomes deteriorated. In order to cope with that, conventionally, attempts to use a material having larger dielectric constant than the silicon oxide film, the so-called high-k material as the gate insulative film have been made.

However, the high-k material has low heat resistance and poor compatibility to the conventional semiconductor manufacturing process. For example, in the case where the high-k material is used as the gate insulative film, because many of the high-k materials are metal oxide, $SiO_2$ or silicate is formed at the interface between the high-k material and the silicon substrate. Because of this interfacial reaction, it is very difficult to form the high-k material having an oxide film reduced thickness (hereinafter, referred to as EOT (Equivalent Oxide Thickness)) of equal to or less than 1 nm on the silicon substrate at present.

Accordingly, in order to avoid the interfacial reaction, a semiconductor device using a gate insulative film including a multilayer film of silicon nitride film and silicon oxide film (hereinafter, also referred to as "ON multilayer film") is known (see Publication of Japanese Patent Application No. 2002-83960 (hereinafter, referred to as "Patent Document 1")

When the ON multilayer film is adopted in place of the high-k material, the interfacial reaction between the silicon substrate and the gate insulative film can be suppressed. However, since the dielectric constant of the ON multilayer film is lower than that of the high-k material, the EOT of the entire gate insulative film rises. In the patent document 1, a semiconductor manufacturing process for reducing the EOT of the gate insulative film while using the ON multilayer film for the gate insulative film is disclosed.

However, by the semiconductor manufacturing process disclosed in the patent document 1, the EOT of the gate insulative film can not be reduced sufficiently. Further, since suitable process conditions are not disclosed in the document, the thickness of the gate insulative film can not be formed uniformly. In case that a silicon nitride film is formed at high temperature, if the physical thickness of the gate insulative film becomes equal to or less than 2 nm, non-uniformity of the thickness of a few atom layers occurs. This non-uniformity of the thickness causes non-uniformity of the threshold voltage, because the non-uniformity of the thickness causes variability of a silicon oxide film which is formed by oxidation of the silicon nitride film. This leads to reliability deterioration of the semiconductor device. The problem about non-uniformity of the silicon nitride film is also pointed out in D. Matshushita, et al., Jpn. J. Appl. Phys. 40(2001) p2827 (hereinafter, referred to as "Non-patent Document 1").

SUMMARY OF THE INVENTION

An advantage of an aspect of the present invention is to provide a manufacturing method for a semiconductor device having a gate insulative film that has an uniform thickness and a lower EOT than the conventional one and includes nitride and oxide such as an ON multilayer film in order to solve the above described problems.

A semiconductor device manufacturing method according to an embodiment of the invention comprises: forming a first nitride film on a semiconductor substrate; forming a first oxide film between said semiconductor substrate and said nitride film and forming a second oxide film on said nitride film; forming a second nitride film or an oxide and nitride film on said first nitride film by nitriding said second oxide film; and forming a gate electrode on a gate insulative film including said first oxide film, said first nitride film, and said second nitride film or said oxide and nitride film.

DETAILED DESCRIPTION OF THE INVENTION

Figure 1:
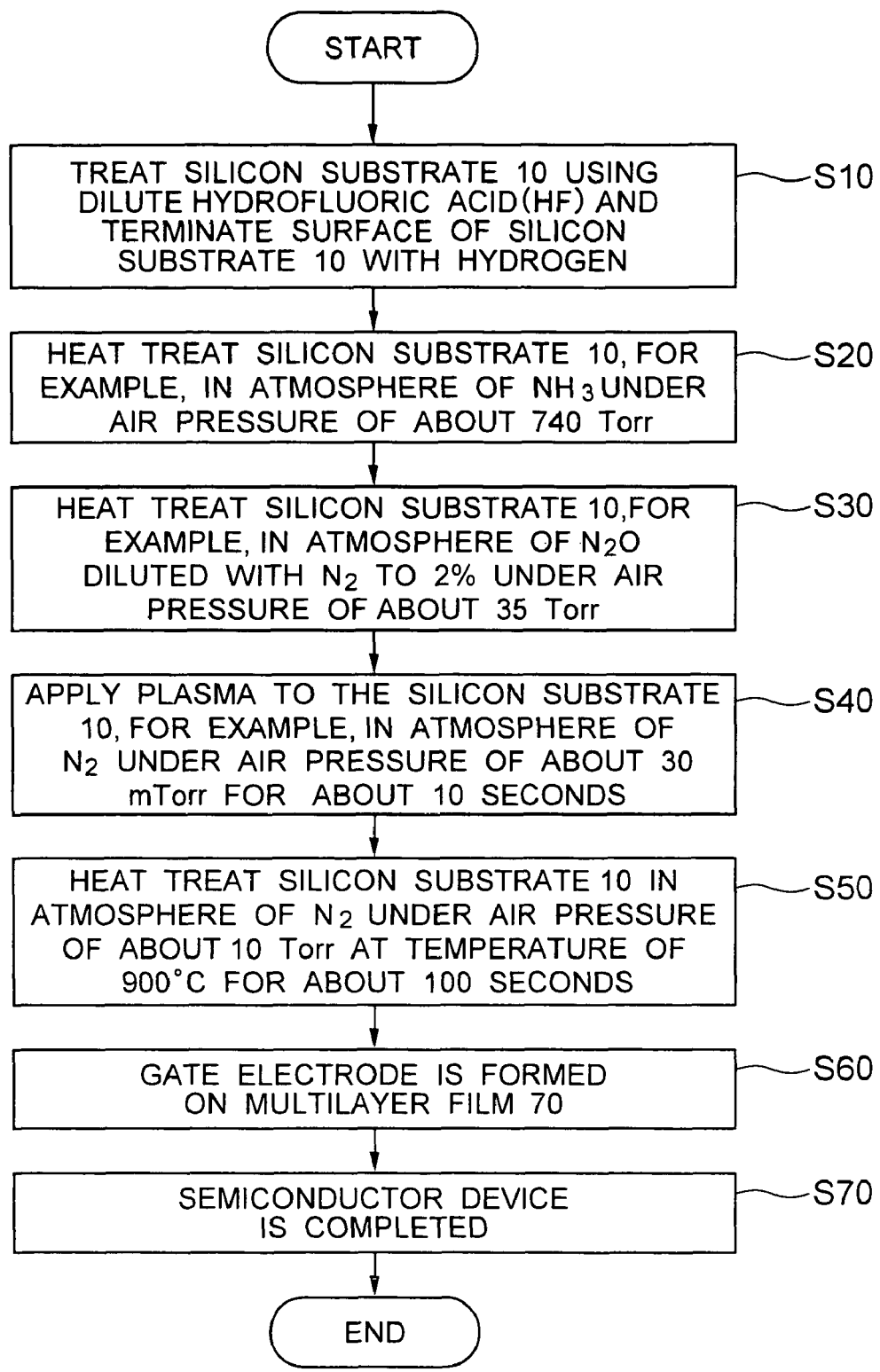
FIG. 1 is a flowchart showing a semiconductor device manufacturing method according to a first embodiment of the invention in the order of the processes.

Hereinafter, referring to the drawings, embodiments according to the invention will be described. These embodiments are not for limiting the invention.

In semiconductor device manufacturing methods according to the embodiments of the invention, a gate insulative film is formed by oxidizing a nitride film formed on a silicon substrate, and then, nitriding the oxidized film formed on the surface of the nitride film again. Thereby, a gate insulative film having an uniform thickness and an lower EOT than the conventional one can be formed on the silicon substrate.

FIRST EMBODIMENT

FIG. 1 is a flowchart showing a semiconductor device manufacturing method according to the first embodiment of the invention in the order of the processes. FIGS. 2 to 5 are sectional flow views showing the semiconductor device manufacturing method according to the first embodiment by the sections of the semiconductor substrate. Referring to FIGS. 1 to 5, the manufacturing method according to the embodiment will be described.

Figure 2:
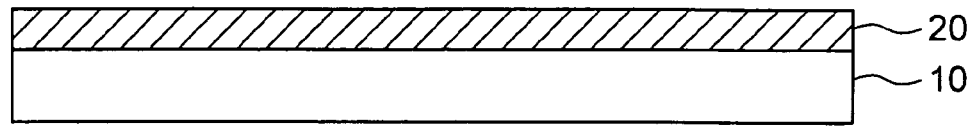
FIG. 2 is a sectional flow view showing the semiconductor device manufacturing method according to the first embodiment by the section of the semiconductor substrate.

First, a silicon substrate 10 is treated using dilute hydrofluoric acid (HF), and the surface of the silicon substrate 10 is terminated with hydrogen (S10). Thereby, particles are prevented from adhering to the surface of the silicon substrate 10. Then, the silicon substrate 10 is heat treated, for example, in an atmosphere of $NH_3$ under air pressure of about 740 Torr (S20). Thereby, as shown in FIG. 2, a silicon nitride film 20 is formed on the silicon substrate 10.

Figure 3:
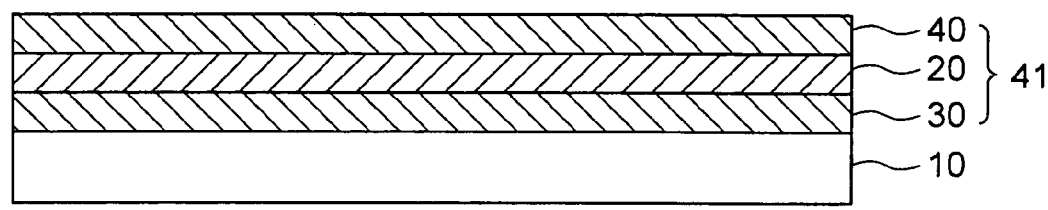
FIG. 3 is a sectional flow view showing the semiconductor device manufacturing method subsequent to FIG. 2.

Next, the silicon substrate 10 is heat treated, for example, in an atmosphere of $N_2O$ diluted with $N_2$ to 2% under air pressure of about 35 Torr (S30). Thereby, as shown in FIG. 3, a silicon oxide film 30 is formed at an interface between the silicon nitride film 20 and the silicon substrate 10, and a silicon oxide film 40 is formed on the surface of the silicon nitride film 20. Hereinafter, an insulative film consisting of the silicon nitride film 20, the silicon oxide film 30, and the silicon oxide film 40 is referred to as an ONO film 41.

Figure 4:
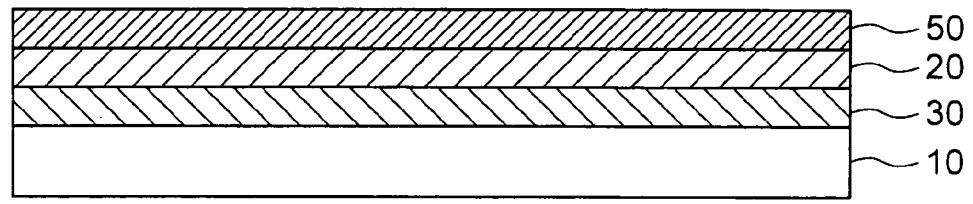
FIG. 4 is a sectional flow view showing the semiconductor device manufacturing method subsequent to FIG. 3.
Figure 5:
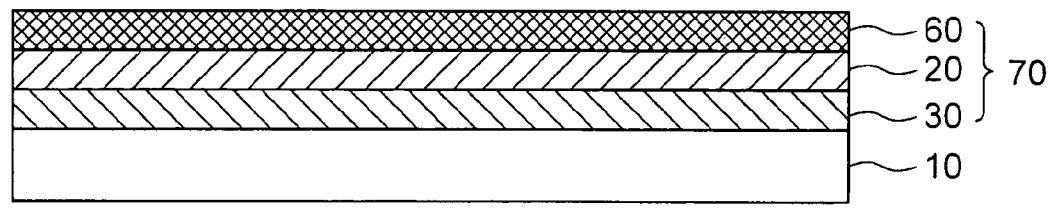
FIG. 5 is a sectional flow view showing the semiconductor device manufacturing method subsequent to FIG. 4.

Then, for example, in an atmosphere of $N_2$ under air pressure of about 30 mTorr, plasma is applied to the silicon substrate 10 for about 10 seconds (S40). Thereby, as shown in FIG. 4, nitrogen is introduced into the silicon oxide layer 40, and a silicon nitride film or silicon oxide and nitride film (SiON) 50 (hereinafter, also simply referred to as an insulative film 50) is formed on the surface of the silicon nitride film 20.

Further, the silicon substrate 10 is heat treated in an atmosphere of $N_2$ under air pressure of about 10 Torr at temperature of 900° C. for about 100 seconds (S50). Thereby, the dangling bond in the insulative film 50 is bonded to nitrogen atoms to constitute stable Si—N bonding within the insulative film 50. Therefore, a silicon nitride film or silicon oxide and nitride film 60 (hereinafter, also simply referred to as an insulative film 60) having a bonding condition more stable than that of the insulative film 50 is formed on the surface of the silicon nitride film 20 (see FIG. 5). The nitrogen concentration within the insulative film 60 is the highest near the silicon nitride film 20 and gradually becomes lower toward the surface of the insulative film 60.

Thus, a multilayer film 70 consisting of the silicon oxide film 30, the silicon nitride film 20, and the insulative film 60 is formed on the silicon substrate 10. Subsequently, a gate electrode (not shown) is formed on the multilayer film 70 (S60). Further, a semiconductor device is completed using a conventional process (S70). In this semiconductor device, the multilayer film 70 serves as a gate insulative film.

By including the silicon nitride film 20 in the gate insulative film 70, not only interface reaction but also penetration of boron can be suppressed. Further, by oxidizing the interface between the silicon nitride film 20 and the silicon substrate 10, deterioration in driving performance of the semiconductor device can be suppressed.

The embodiment uses $NH_3$ gas in step S20. However, as the nitrogen gas, N* (N radical) or $N_2$* ($N_2$ radical) may be used. Further, as the $NH_3$ gas, $NH_3$ gas diluted with $N_2$ or diluted with noble gas may be used. Furthermore, other material including nitrogen atoms may be used in place of $NH_3$, N*, or $N_2$*.

As long as the uniform silicon nitride film 20 is formed, the kind of gas and heat treatment time in step S20 can be combined variously. For example, in the embodiment, air pressure is set to 740 Torr in step S20. However, as long as the silicon nitride film 20 having an uniform thickness is formed, the silicon substrate 10 may be heat treated under air pressure other than 740 Torr. This air pressure can be combined variously according to the heat treatment time and heat treatment temperature.

In the embodiment, in step S30, $N_2O$ diluted with $N_2$ to 2% is used However, as long as the silicon oxide film 30 having an uniform thickness is formed at an interface, that is, as long as the interfacial oxidative reaction occurs between the silicon substrate 10 and the silicon nitride film 20, other gas including oxygen may be used. Further, in the embodiment, $N_2$ is used as a dilution gas of $N_2O$, however, noble gas may be used as the dilution gas thereof. Furthermore, $N_2O$ may be used without being diluted.

In the embodiment, in step S30, air pressure is set to 35 Torr. However, as long as the silicon oxide films 30 and 40 having uniform thicknesses are formed, the silicon substrate 10 may be heat treated under air pressure other than 35 Torr. This air pressure can be combined variously according to the heat treatment time and heat treatment temperature.

Figure 6:
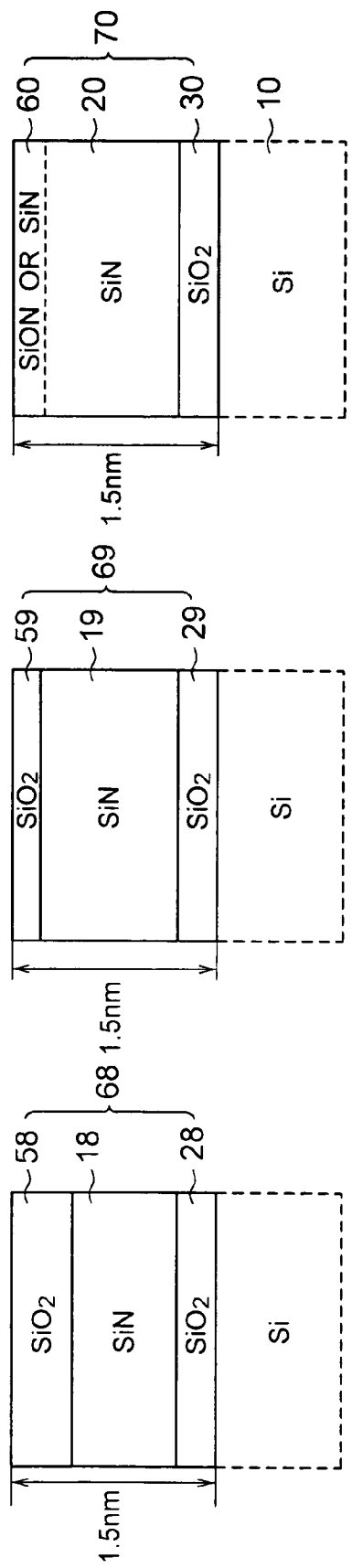
FIG. 6A is a sectional view of gate insulative film 68 manufactured by a conventional method.
FIG. 6B is a sectional view of gate insulative film 69 manufactured by a conventional method.
FIG. 6C is a sectional view of a gate insulative film 70 manufactured according to the embodiment.
Figure 7:
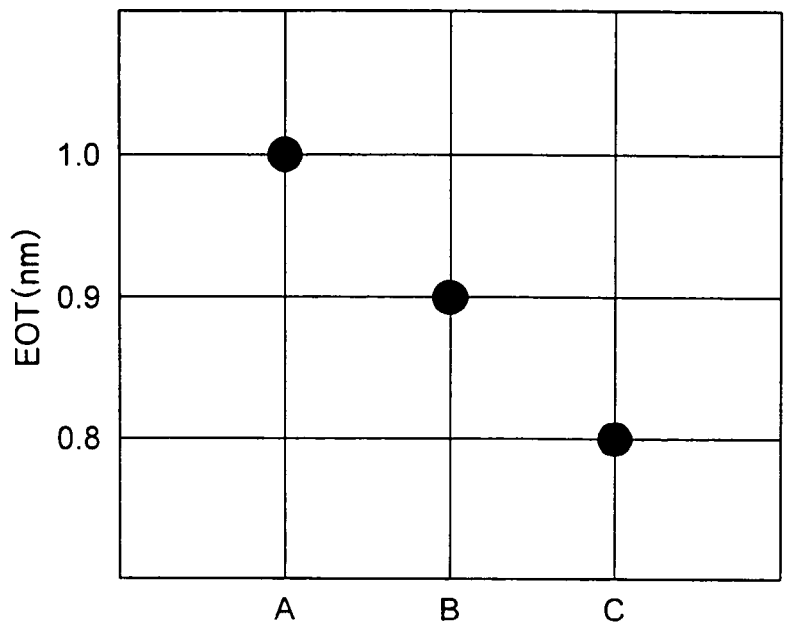
FIG. 7 is a graph showing comparison between the gate insulative films 68 to 70 with respect to EOT.

Referring to FIGS. 6A to 7, an advantage of the invention will be described.

FIGS. 6A and 6B are sectional views of gate insulative films 68 and 69 manufactured by the conventional method. FIG. 6C is a sectional view of a gate insulative film 70 manufactured according to the embodiment. Note that the gate insulative film 69 shown in FIG. 6B is manufactured by the method disclosed in the patent document 1. All of the physical thicknesses of the respective gate insulative films 68, 69, 70 are about 1.5 nm.

FIG. 7 is a graph showing comparison between the respective gate insulative films 68 to 70 shown in FIGS. 6A to 6C with respect to EOT The EOT of the gate insulative film 68 shown in FIG. 6A is expressed by "A", the EOT of the gate insulative film 69 shown in FIG. 6B is expressed by "B", and the EOT of the gate insulative film 70 shown in FIG. 6C is expressed by "C".

As shown in FIG. 6A, the EOT of the gate insulative film 68 manufactured by the conventional method is 1.0 nm. As shown in FIG. 6B, the EOT of the gate insulative film 69 manufactured by the method disclosed in the patent document 1 is 0.9 nm. By contrast, as shown in FIG. 6C, the EOT of gate insulative film 70 manufactured by the method according to the embodiment is 0.8 nm. Thus, the gate insulative film 70 according to the embodiment has a smaller EOT than the gate insulative films 68 and 69 manufactured by the conventional method.

As described above, the factor causing difference in EOT is the thickness of the silicon oxide film on the silicon nitride film. In the conventional gate insulative films 68 and 69 shown in FIGS. 6A and 6B, the existence of silicon oxide films 58 and 59 having low dielectric constant on the silicon nitride film causes higher EOT of the entire gate insulative film. By contrast, in the gate insulative film 70 according to the embodiment shown in FIG. 6C, the silicon nitride film or silicon oxide and nitride film exists on the silicon nitride film 20, however, the silicon oxide film hardly exists. Accordingly, the EOT of the entire gate insulative film becomes lower than that of the conventional gate insulative film.

According to the method disclosed in the patent document 1, the silicon oxide film formed on the surface of the silicon nitride film 19 is removed. However, in order to remove the silicon oxide film, the silicon substrate is required to be exposed to the hydrofluoric acid solution. Thereby, the silicon oxide film on the silicon nitride film 19 is etched once, however, re-oxidization of the surface of the silicon nitride film 19 by $H_2O$ in the solution can not be avoided. Accordingly, as shown in FIG. 6B, the silicon oxide film 59 remains on the surface of the silicon nitride film 19.

By contrast, according to the embodiment, in steps S50 and S60, the silicon oxide film 40 on the silicon nitride film 20 is not eliminated but nitrided. That is, there is no need of exposure to the hydrofluoric acid solution, and the surface of the silicon nitride film 20 is not re-oxidized.

Further, in the process shown in FIG. 1, steps S40 to S60 can continuously treat the silicon substrate 10 within the same chamber. Thereby, the process from nitriding the silicon oxide film 30 to forming the gate electrode can be performed within the same chamber. As a result, since the surface of the insulative film 60 is not exposed to the outside air, formation of the natural oxide film on the surface of the insulative film 60 can also be avoided.

SECOND EMBODIMENT

Figure 8:
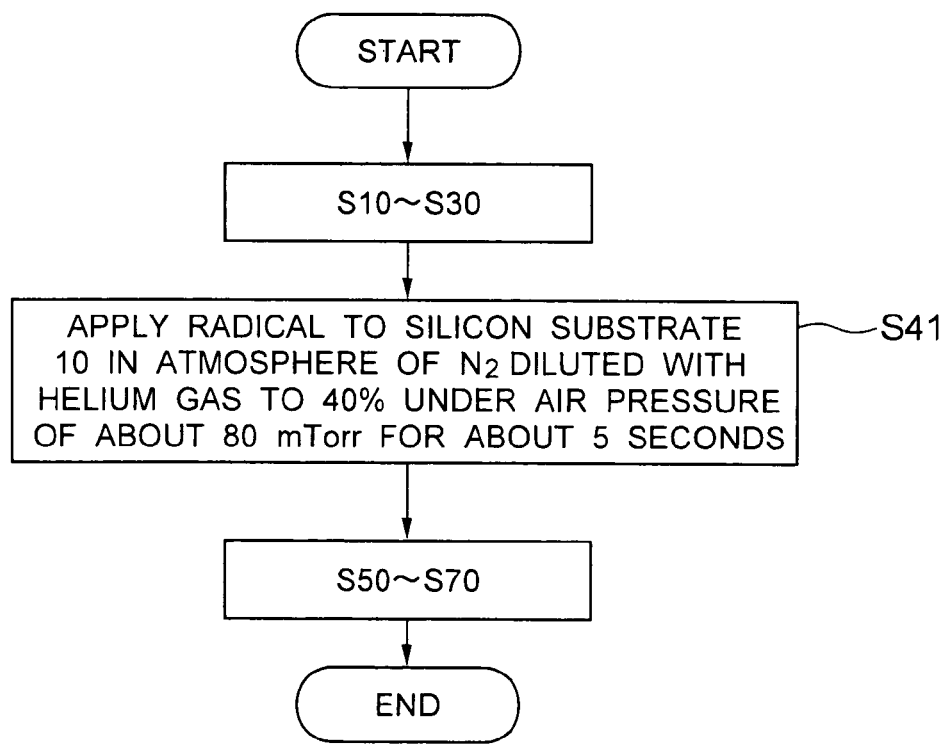
FIG. 8 is a flowchart showing a semiconductor device manufacturing method according to a second embodiment of the invention in the order of processes.

FIG. 8 is a flowchart showing a semiconductor device manufacturing method according to the second embodiment of the invention in the order of processes. The sectional flow views of the embodiment will be omitted because they are the same as FIGS. 2 to 5. The embodiment is different from the first embodiment in the point where step S41 in which nitriding conditions are limited is included in place of step S40 shown in FIG. 1.

First, steps S10 to S30 shown in FIG. 1 are executed. Thereby, the sectional structure shown in FIG. 3 is obtained.

Then, for example, radical is applied to the silicon substrate 10 in an atmosphere of $N_2$ diluted with helium gas to 40% under air pressure of about 80 mTorr for about 5 seconds (S41). Thereby, as shown in FIG. 4, nitrogen is introduced into the silicon oxide film 40, and the silicon nitride film or silicon oxide and nitride film (SiON) 50 is formed on the surface of the silicon nitride film 20.

Further, the silicon substrate 10 is heat treated, for example, in an atmosphere of $N_2$ under air pressure of about 10 Torr at temperature of 900° C. for about 100 seconds (S50). Thereby, the dangling bond in the insulative film 50 is bonded to nitrogen atoms to constitute stable Si—N bonding within the insulative film 50. Therefore, the silicon nitride film or silicon oxide and nitride film 60 (hereinafter, also simply referred to as an insulative film 60) having a bonding condition more stable than that of the insulative film 50 is formed on the surface of the silicon nitride film 20 (see FIG. 5). The nitrogen concentration within the insulative film 60 is the highest near the silicon nitride film 20 and gradually becomes lower toward the surface of the insulative film 60.

Thus, the multilayer film 70 consisting of the silicon oxide film 30, the silicon nitride film 20, and the insulative film 60 is formed on the silicon substrate 10. Subsequently, the gate electrode (not shown) is formed on the multilayer film 70 (S60). Further, the semiconductor device is completed using the conventional process (S70). In this semiconductor device, the multilayer film 70 serves as a gate insulative film.

Figure 9:
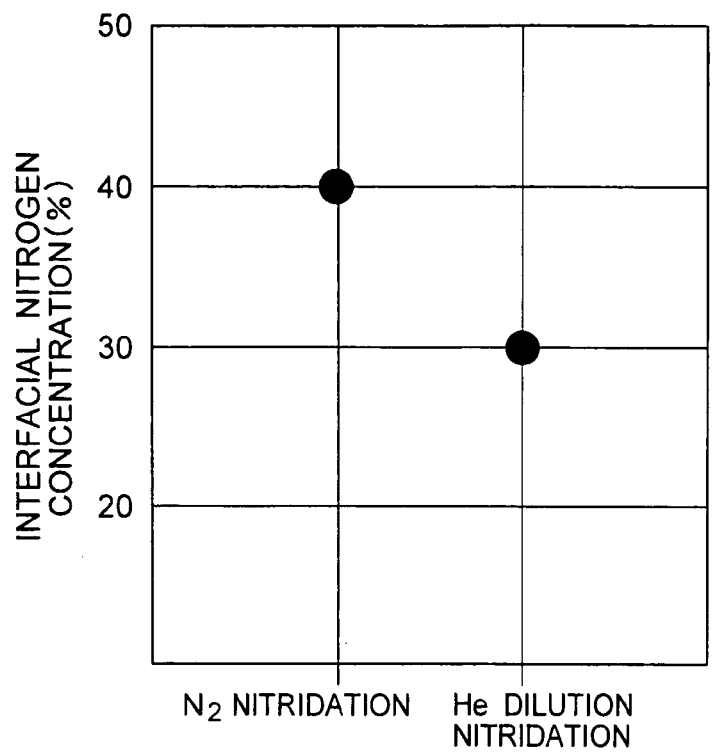
FIG. 9 is a graph showing the comparison between interfacial nitrogen concentrations of a gate insulative film nitrided in an atmosphere of $N_2$ under air pressure of about 30 mTorr for 10 seconds in step S41 and a gate insulative film nitrided in an atmosphere of $N_2$ diluted with helium gas to 40% under air pressure of about 80 mTorr for 5 seconds in step S41.
Figure 10:
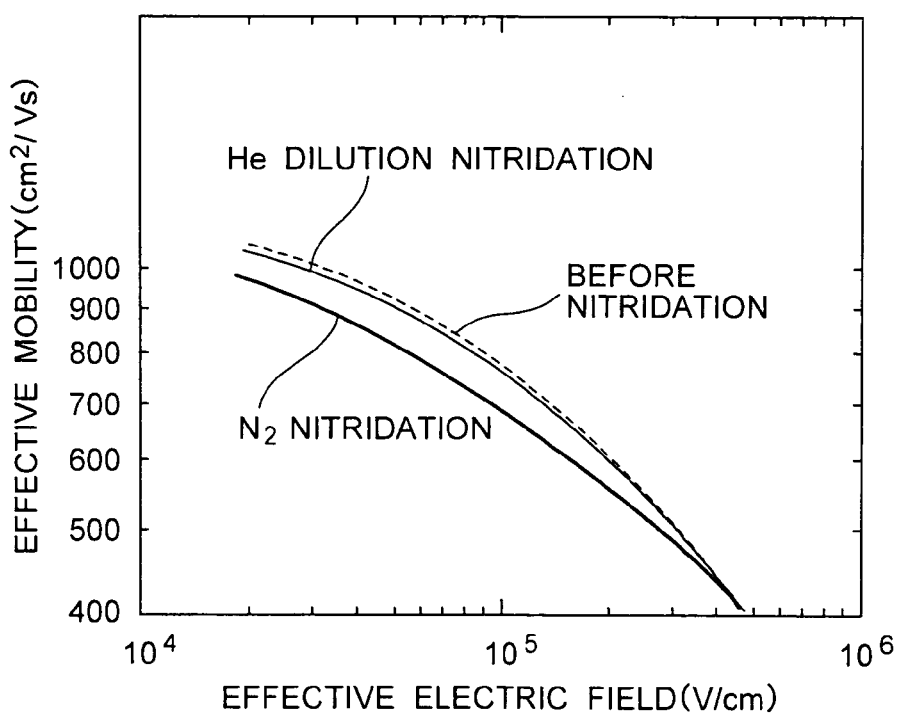
FIG. 10 is a graph showing the comparison between the gate insulative film nitrided in an atmosphere of $N_2$ under air pressure of about 30 mTorr in step S41 and the gate insulative film nitrided in an atmosphere of $N_2$ diluted with helium gas to 40% under air pressure of about 80 mTorr in step S41 with respect to effective mobility with the gate insulative film before nitrided as reference.

Referring to FIGS. 9 and 10, an advantage of the embodiment will be described.

FIG. 9 is a graph showing the comparison between interfacial nitrogen concentrations of the gate insulative film nitrided in an atmosphere of $N_2$ under air pressure of about 30 mTorr for 10 seconds in step S41 and the gate insulative film nitrided in an atmosphere of $N_2$ diluted with helium gas to 40% under air pressure of about 80 mTorr for 5 seconds in step S41. It is seen that the interfacial nitrogen concentration is reduced by the dilution with the helium gas and raising pressure to shorten the nitriding time.

FIG. 10 is a graph showing the comparison between the gate insulative film nitrided in an atmosphere of $N_2$ under air pressure of about 30 mTorr in step S41 and the gate insulative film nitrided in an atmosphere of $N_2$ diluted with helium gas to 40% under air pressure of about 80 mTorr in step S41 with respect to effective mobility with the gate insulative film before nitrided as reference. The effective mobility is the effective mobility of electrons or holes flowing in the silicon substrate 10 immediately below the gate insulative film. Higher effective mobility means faster signal processing speed of the semiconductor device.

From the graph shown in FIG. 10, it is seen that decrease in effective mobility is suppressed by diluting with helium gas, raising the pressure and shortening the nitriding time.

In the embodiment, the reason for suppression of decrease in effective mobility is as follows: By diluting with helium gas and raising the pressure, the distance (mean free path) in which the nitrogen radical can move without losing energy (while keeping reactivity) is reduced. That is, decrease in an oxygen amount of the interface due to nitriding of the interface by the nitrogen radical having high energy can be prevented. Accordingly, the oxygen amount of the interface between the silicon oxide film 30 and the silicon substrate 10 can be maintained at the same level as that before nitrided. As a result, in the embodiment, decrease in effective mobility is suppressed.

In step S41 of the embodiment, plasma may be applied to the silicon substrate 10 in an atmosphere of $N_2$ diluted with helium gas to 40% under air pressure of about 80 mTorr for about 5 seconds.

The embodiment also has the same advantage as that of the first embodiment.

THIRD EMBODIMENT

Figure 11:
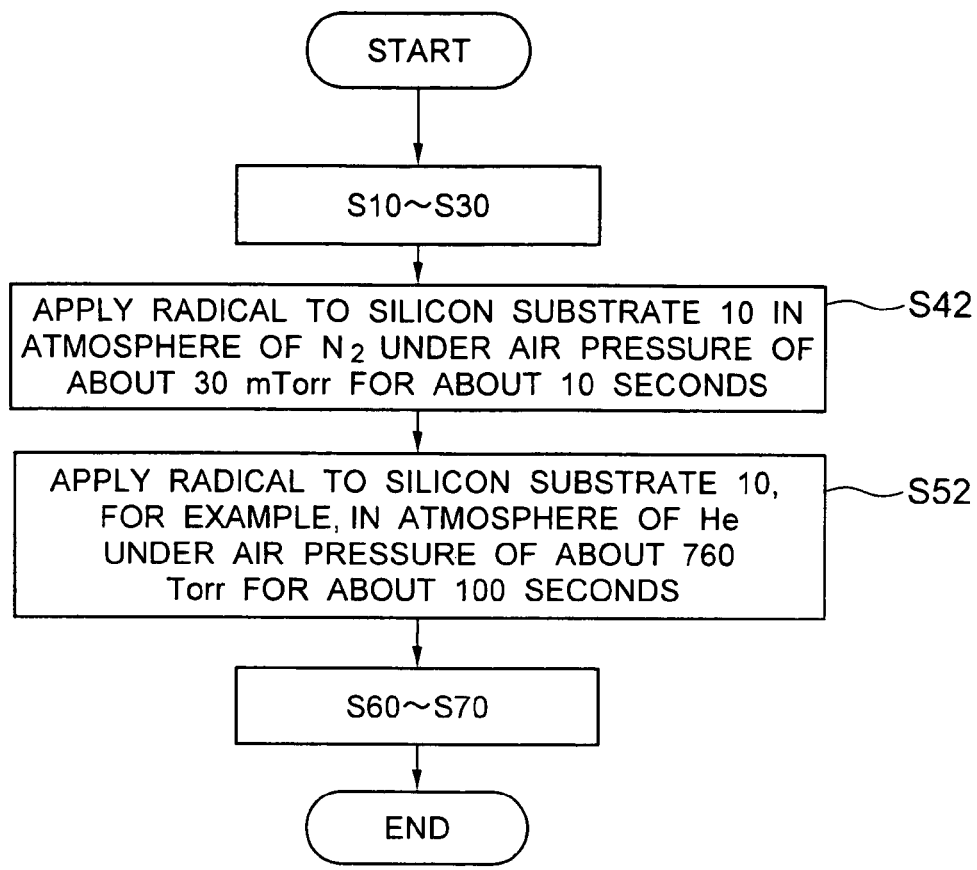
FIG. 11 is a flowchart showing a semiconductor device manufacturing method according to a third embodiment of the invention in the order of processes.

FIG. 11 is a flowchart showing a semiconductor device manufacturing method according to the third embodiment of the invention in the order of processes. The sectional flow views of the embodiment will be omitted because they are the same as FIGS. 2 to 5.

First, steps S10 to S30 shown in FIG. 1 are executed. Thereby, the sectional structure shown in FIG. 3 is obtained.

Then, for example, radical is applied to the silicon substrate 10 in an atmosphere of $N_2$ under air pressure of about 30 mTorr for about 10 seconds (S42). Thereby, as shown in FIG. 4, nitrogen is introduced into the silicon oxide film 40, and the silicon nitride film or silicon oxide and nitride film (SiON) 50 is formed on the surface of the silicon nitride film 20.

Then, the silicon substrate 10 is heat treated, for example, in an atmosphere of helium under air pressure of about 760 Torr at temperature of 900° C. for about 100 seconds (S52). Thereby, the dangling bond in the insulative film 50 is bonded to nitrogen atoms to constitute stable Si—N bonding within the insulative film 50. Therefore, the silicon nitride film or silicon oxide and nitride film 60 having a bonding condition more stable than that of the insulative film 50 is formed on the surface of the silicon nitride film 20 (see FIG. 5). Further, since the helium suppresses the reaction between the silicon oxide film 30 and the silicon substrate 10, the interface between the silicon oxide film 30 and the silicon substrate 10 is maintained flat. That is, the roughness of the interface between the silicon oxide film 30 and the silicon substrate 10 is maintained small.

Furthermore, steps S60 to S70 are executed and the semiconductor device is completed.

Figure 12:
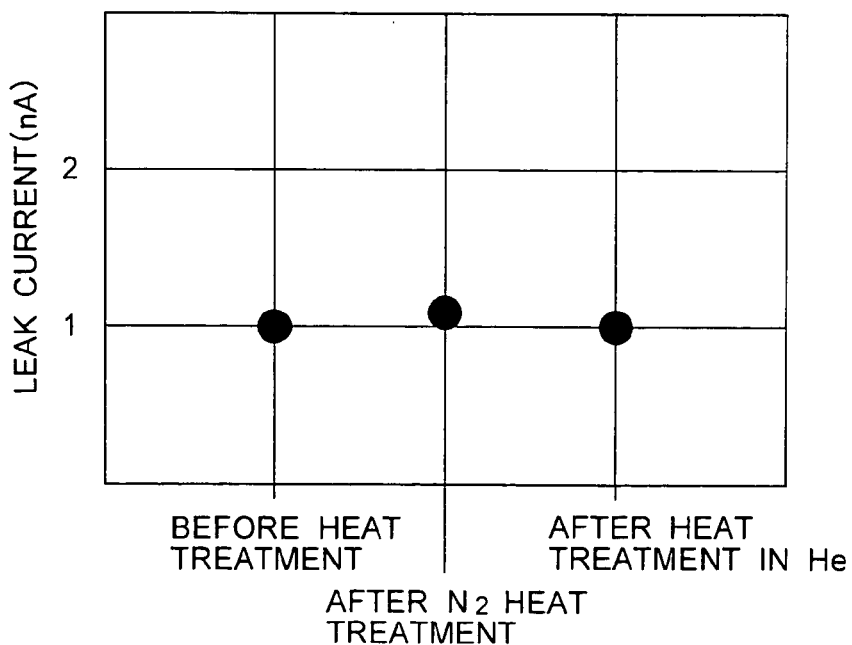
FIG. 12 is a graph showing comparison between a gate insulative film heat treated in a helium gas atmosphere and a gate insulative film heat treated in a nitrogen gas atmosphere in step S52 with respect to leak current.
Figure 13:
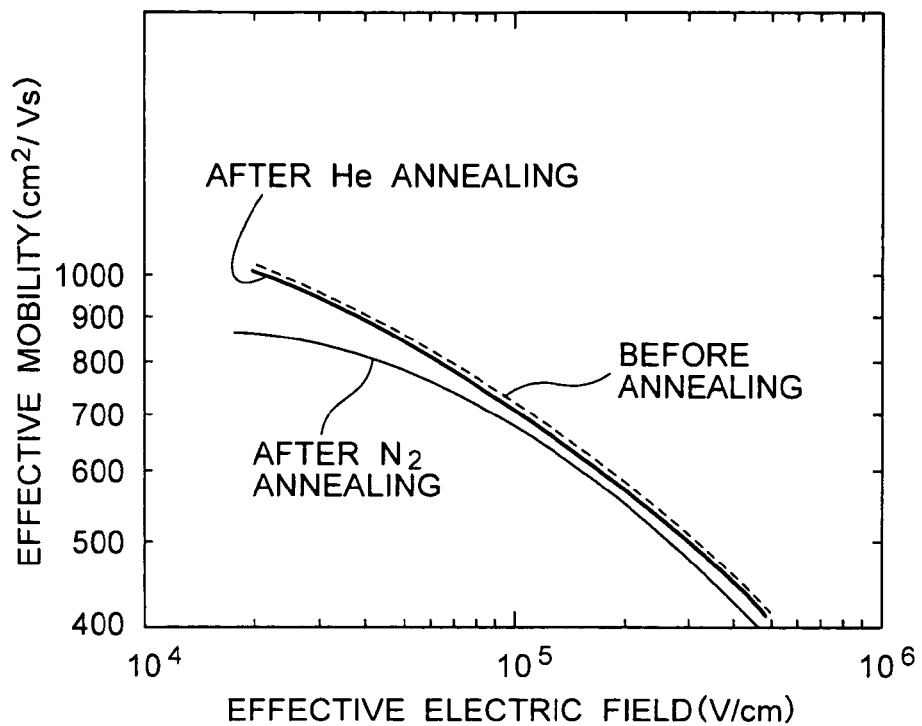
FIG. 13 is a graph showing the comparison between the gate insulative film heat treated in a helium gas atmosphere and the gate insulative film heat treated in a nitrogen gas atmosphere in step S52 with respect to effective mobility.

Referring to FIGS. 12 and 13, an advantage of the invention will be described.

FIG. 12 is a graph showing comparison between a gate insulative film heat treated in a helium gas atmosphere in step S52 and a gate insulative film heat treated in a nitrogen gas atmosphere in place of helium gas in step S52 with respect to leak current with a gate insulative film before heat treatment as reference.

The leak current of the gate insulative film is observed using a conductive AFM (Atomic Force Microscope). The vertical axis of the graph indicates the current value flowing in a gate insulative films when 10 MV/cm is applied to the gate insulative film between the AFM chip and the silicon substrate 10. From the graph shown in FIG. 12, it is seen that there is no difference between these gate insulative films with respect to leak current.

FIG. 13 is a graph showing the comparison between the gate insulative film heat treated in a helium gas atmosphere in step S52 and the gate insulative film heat treated in a nitrogen gas atmosphere in place of helium gas in step S52 with respect to effective mobility with a gate insulative film before heat treatment as reference.

From the graph shown in FIG. 13, it is seen that decrease in effective mobility is suppressed more greatly in the gate insulative film heat treated in a helium gas atmosphere than the gate insulative film heat treated in a nitrogen gas atmosphere.

In the embodiment, the reason for suppression of decrease in effective mobility is as follows: Since helium deprives interface between the gate insulative film and the silicon substrate of atomic vibrational energy by the quench effect, reaction between $SiO_2$ of the gate insulative film and Si of the silicon substrate is suppressed. Accordingly, the roughness of the interface between the silicon oxide film 30 and the silicon substrate 10 can be suppressed as small as that before heat treatment. As a result, in the embodiment, decrease in effective mobility is suppressed.

FOURTH EMBODIMENT

Figure 14:
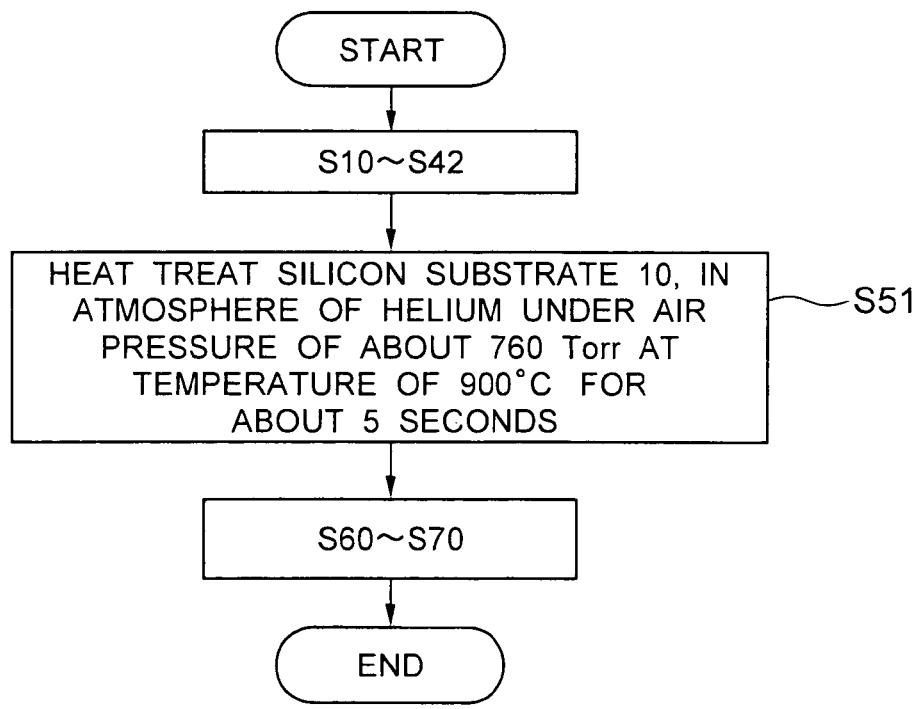
FIG. 14 is a flowchart showing a semiconductor device manufacturing method according to a fourth embodiment of the invention in the order of the processes.

FIG. 14 is a flowchart showing a semiconductor device manufacturing method according to the fourth embodiment of the invention in the order of the processes. The sectional flow views of the embodiment will be omitted because they are the same as FIGS. 2 to 5. The embodiment is different from the third embodiment in the point where step S51 in which heat treatment conditions are limited is included in place of step S50 shown in FIG. 1.

First, steps S10 to S30 shown in FIG. 1 are executed. Thereby, the sectional structure shown in FIG. 3 is obtained.

Then, for example, radical is applied to the silicon substrate 10 in an atmosphere of $N_2$ under air pressure of about 30 mTorr for about 10 seconds (S42). Thereby, as shown in FIG. 4, nitrogen is introduced into the silicon oxide film 40, and the silicon nitride film or silicon oxide and nitride film (SiON) 50 is formed on the surface of the silicon nitride film 20.

Next, the silicon substrate 10 is heat treated, for example, in a helium atmosphere under air pressure of about 760 Torr at temperature of 900° C. for about 5 seconds (S51). Thereby, the dangling bond in the insulative film 50 is bonded to nitrogen atoms to constitute stable Si—N bonding within the insulative film 50. Therefore, the silicon nitride film or silicon oxide and nitride film 60 having a bonding condition more stable than that of the insulative film 50 is formed on the surface of the silicon nitride film 20 (see FIG. 5). Further, since the helium suppresses the reaction between the silicon oxide film 30 and the silicon substrate 10, the interface between the silicon oxide film 30 and the silicon substrate 10 is maintained flat. That is, the roughness of the interface between the silicon oxide film 30 and the silicon substrate 10 is maintained small.

Furthermore, steps S60 to S70 are executed and the semiconductor device is completed.

Figure 15:
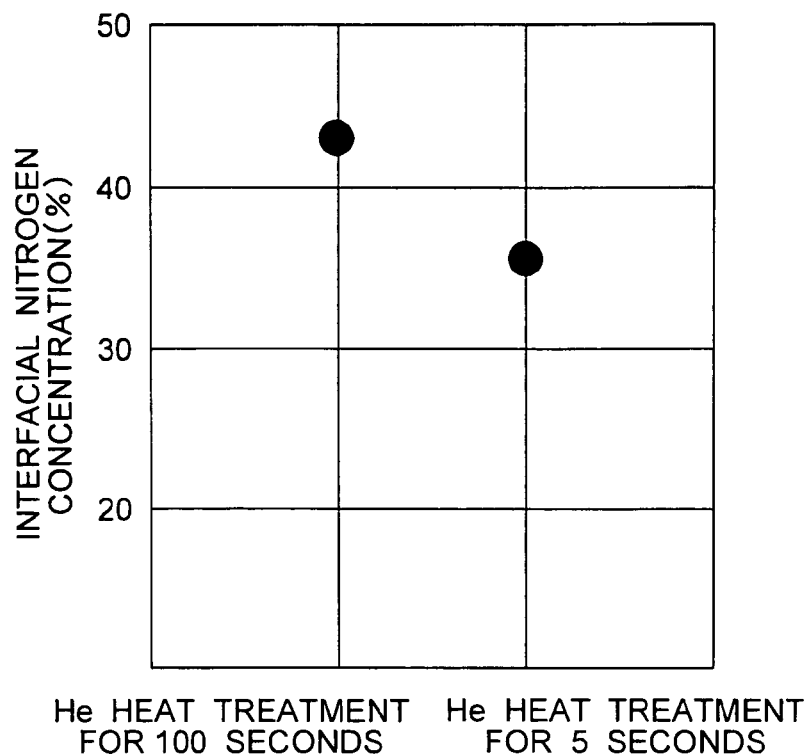
FIG. 15 is a graph showing comparison between interfacial nitrogen concentrations of a gate insulative film heat treated in a helium gas atmosphere for 100 seconds in step S51 and a gate insulative film heat treated in a helium gas atmosphere for 5 seconds in step S51.
Figure 16:
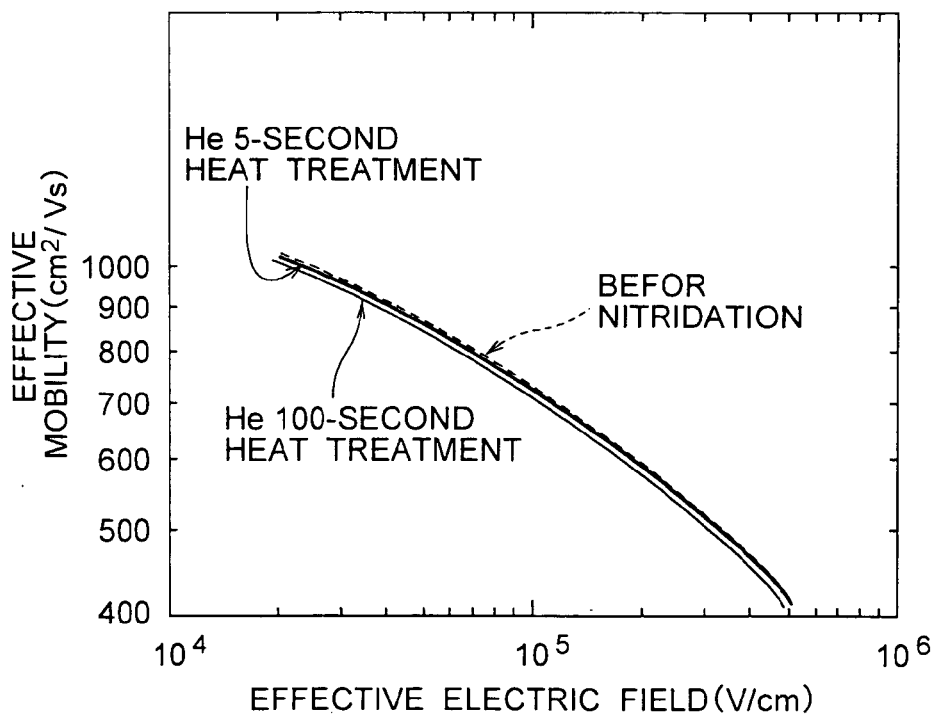
FIG. 16 is a graph showing the comparison between the gate insulative film heat treated in a helium gas atmosphere for 100 seconds in step S51 and the gate insulative film heat treated in a helium gas atmosphere for 5 seconds in step S51 with respect to effective mobility with a gate insulative film before heat treatment as reference.

Referring to FIGS. 15 and 16, an advantage of the invention will be described.

FIG. 15 is a graph showing comparison between interfacial nitrogen concentrations of a gate insulative film heat treated in a helium gas atmosphere for 100 seconds in step S51 and a gate insulative film heat treated in a helium gas atmosphere for 5 seconds in step S51. It is seen that the interfacial nitrogen concentration is reduced by shortening the heat treatment time in the helium gas atmosphere.

FIG. 16 is a graph showing the comparison between the gate insulative film heat treated in a helium gas atmosphere for 100 seconds in step S51 and the gate insulative film heat treated in a helium gas atmosphere for 5 seconds in step S51 with respect to effective mobility with a gate insulative film before heat treatment as reference.

From the graph shown in FIG. 16, it is seen that decrease in effective mobility is hardly seen by shortening the heat treatment time in the helium gas atmosphere.

In the embodiment, the reason for suppression of decrease in effective mobility is as follows: By shortening the heat treatment time in a helium gas atmosphere, the moving distance of non-bonded atoms existing in the insulative film becomes shorter. That is, decrease in an oxygen amount of the interface due to re-nitriding of interface by moving nitrogen molecules and atoms can be prevented. Accordingly, the oxygen amount of the interface between the silicon oxide film 30 and the silicon substrate 10 can be suppressed at the same level as that before heat treatment. As a result, in the embodiment, decrease in effective mobility is suppressed.

The embodiment also has the same advantage as that of the third embodiment.

The step S51 in the embodiment may be executed in place of step S50 in the first or second embodiment. Thereby, the embodiment also has the advantage of the first or second embodiment.

FIFTH EMBODIMENT

Figure 17:
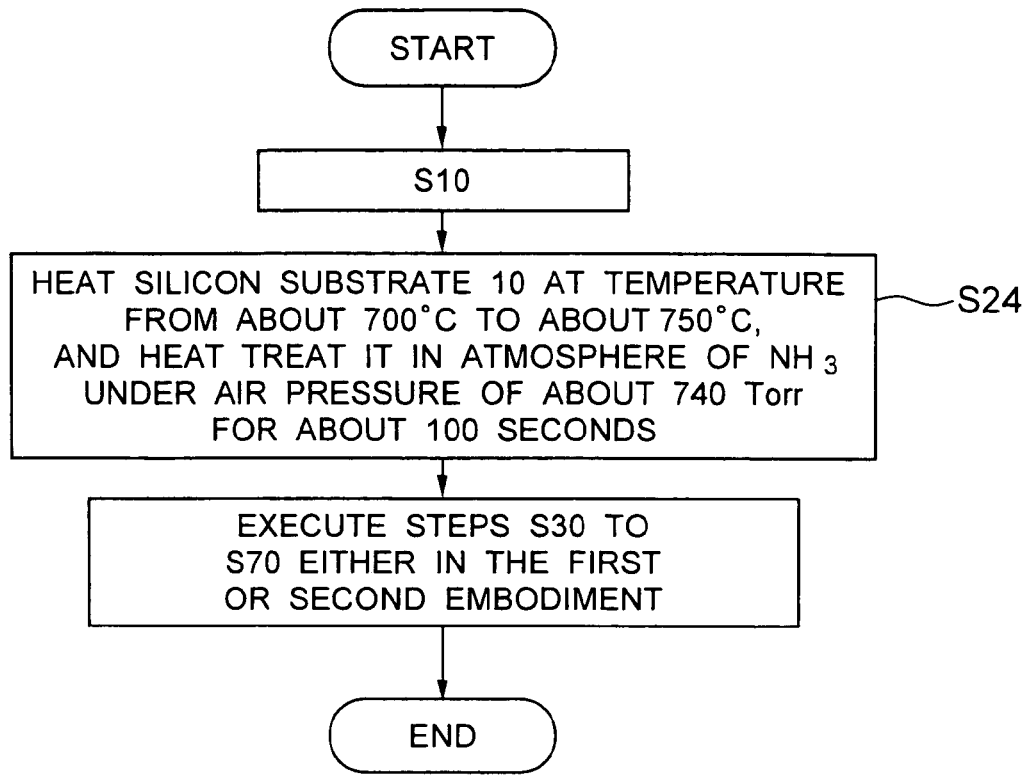
FIG. 17 is a flowchart showing a semiconductor device manufacturing method according to a fifth embodiment of the invention in the order of the processes.

FIG. 17 is a flowchart showing a semiconductor device manufacturing method according to the fifth embodiment of the invention in the order of the processes. The sectional flow views shown by the sections of the semiconductor substrate will be omitted because they are the same as FIGS. 2 to 5. The embodiment is different from the first to fourth embodiments in the point where step S24 in which heat treatment conditions are limited is included in place of step S20.

First, the step S10 shown in FIG. 1 is executed. Then, the silicon substrate 10 is heated at temperature of less than 800° C., specifically from about 700° C. to 750° C., and heat treated in an atmosphere of $NH_3$ under air pressure of about 740 Torr for about 100 seconds (S24). Further, steps S30 to S70 are executed. The steps S30 to S70 may be the same as those in any one of the first to fourth embodiments.

Figure 18:
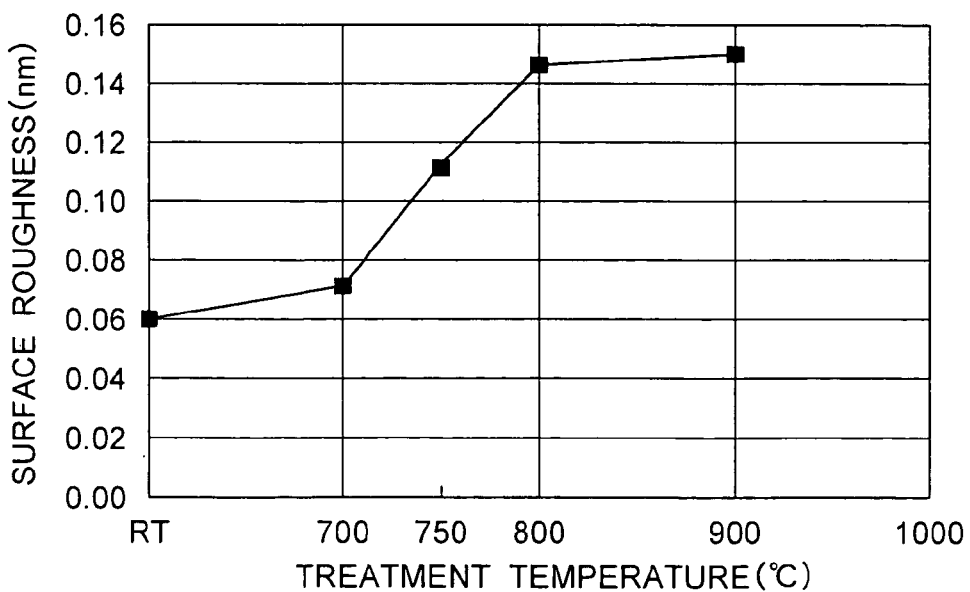
FIG. 18 is a graph showing the relationship between the heat treatment temperature in step S24 and the surface roughness of the silicon nitride film 20.
Figure 19:
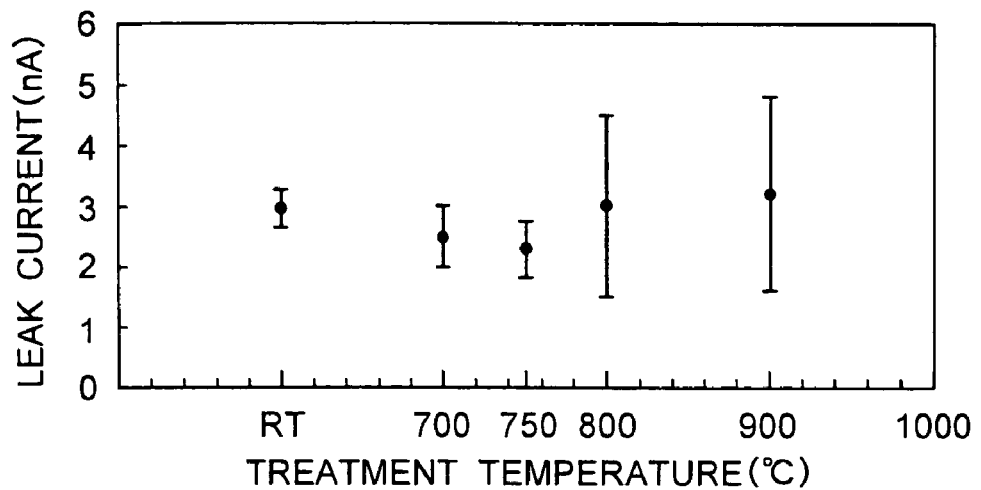
FIG. 19 is a graph showing the relationship between the heat treatment temperature in step S24 and the leak current of the silicon nitride film 20.
Figure 20:
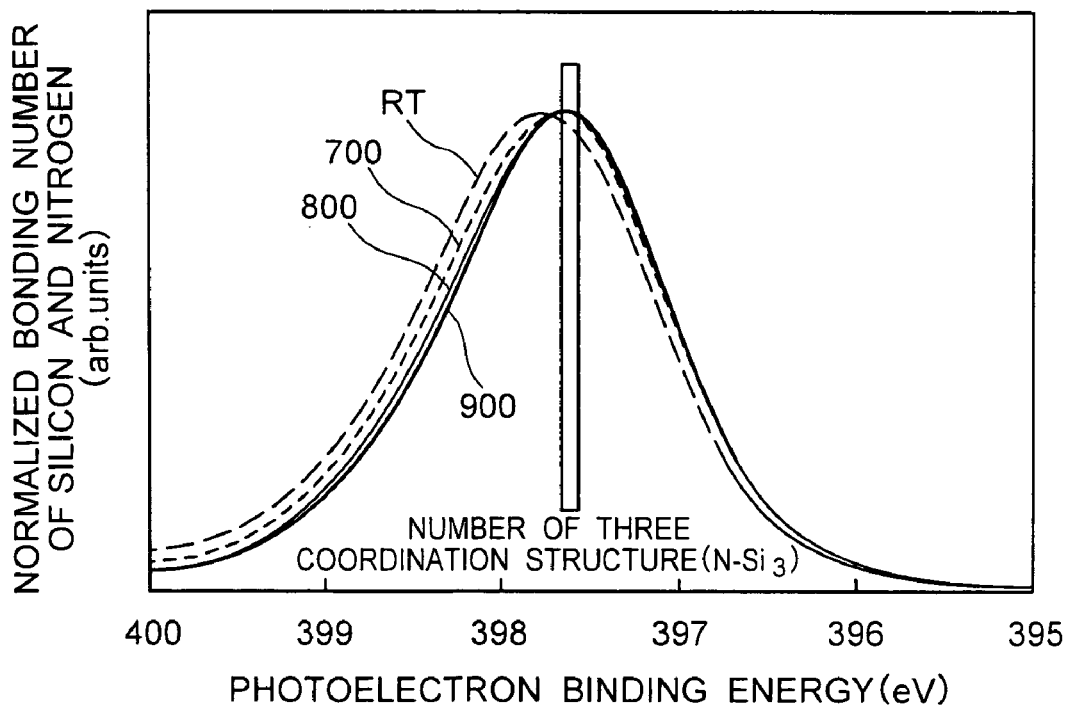
FIG. 20 is a graph showing change in the bonding condition between silicon and nitrogen in the silicon nitride film 20 with respect to each heat treatment temperature in step S24.

Referring to FIGS. 18 to 20, an advantage of the embodiment will be described.

FIG. 18 is a graph showing the relationship between the heat treatment temperature in step S24 and the surface roughness of the silicon nitride film 20 (see FIG. 2). The thickness of the silicon nitride film 20 is about 0.7 nm in any case. "RT" in FIG. 18 means room temperature.

The surface roughness of the silicon nitride film 20 formed at equal to or more than 800° C. in step S24 is about 0.15 nm. By contrast, as the heat treatment temperature is shifted from about 800° C. to about 700° C., the surface roughness of the silicon nitride film 20 is reduced gradually. The surface roughness of the silicon nitride film 20 formed at less than 800° C. is smaller than 0.15 nm. The surface roughness of the silicon nitride film 20 formed at equal to or less than 750° C. is about 0.11 nm. Further, the surface roughness of the silicon nitride film 20 formed at equal to or less than about 700° C. becomes equal to or less than 0.08 nm. This is the equivalent value to that of the silicon thermally-oxidized film.

The lower surface roughness of the silicon nitride film 20 means that the silicon nitride film 20 is flatter. The flatter silicon nitride film 20 reduces leak current of the gate insulative film 70 (see FIG. 5) including the silicon nitride film 20 and improves the reliability of the gate insulative film 70. Accordingly, in light of surface roughness shown in FIG. 18, the heat treatment temperature in step S24 is preferably less than about 800° C., and more preferably, equal to or less than 750° C., and even more preferably, equal to or less than 700° C.

FIG. 19 is a graph showing the relationship between the heat treatment temperature in step S24 and the leak current of the silicon nitride film 20. The leak current of the silicon nitride film 20 is observed using a conductive AFM. The vertical axis of the graph indicates the current value flowing in the silicon nitride film 20 when 10 MV/cm is applied to the silicon nitride film 20 between the AFM chip and the silicon substrate 10.

When the heat treatment temperature in step S24 exceeds 800° C., the leak current of the silicon nitride film 20 varies widely, and the average value thereof becomes higher. On the other hand, when the heat treatment temperature in step S24 is less than about 800° C., the leak current of the silicon nitride film 20 varies slightly. Specifically, when the heat treatment temperature is from about 700° C. to about 750° C., the average value of the leak current of the silicon nitride film 20 becomes smaller. Accordingly, in light of leak current shown in FIG. 19, the heat treatment temperature in step S24 is preferably less than about 800° C., and more preferably from about 700° C. to about 750° C.

FIG. 20 is a graph showing change in the bonding condition between silicon and nitrogen in the silicon nitride film 20 with respect to each heat treatment temperature in step S24. This graph is measured by XPS (X-ray photoelectron spectroscopy). The horizontal axis indicates photoelectron binding energy. The vertical direction indicates the normalized number of three coordination structure (N—$Si_3$).

Here, the three coordination structure (N—$Si_3$) is a structure of silicon nitride in which three silicon atoms and four nitrogen atoms are bonded and has no dangling bond that causes to form an energy level in the band gap. Therefore, the formation of the three coordination structure by the silicon nitride film 20 reduces leak current.

The three coordination structure has photoelectron binding energy of about 397.76 eV. That is, the bonding number shown inside the frame in FIG. 20 is bonding number having three coordination structure. As shown in FIG. 20, the higher the heat treatment temperature in step S24, the larger the bonding number having three coordination structure (N—$Si_3$). Accordingly, in light of three coordination structure, the higher the heat treatment temperature in step S24, the more the leak current is considered to be reduced. That is, it is preferred that the heat treatment temperature in step S24 is higher in light of three coordination structure.

However, as shown in FIGS. 18 and 19, in light of surface roughness and leak current, it is not preferable that the heat treatment temperature in step S24 is set to equal to or more than about 800° C. Therefore, the heat treatment temperature in step S24 is judged as being most suitable from about 700° C. to about 800° C., and specifically, from about 700° C. to 750° C.

According to the embodiment, by optimizing the heat treatment temperature in step S24, the silicon nitride film 20 having relatively small surface roughness and less dangling bond can be formed. Thereby, the silicon nitride film 20 causing less leak current can be formed and the reliability of the gate insulative film 70 is improved.

In step S24, $NH_3$ gas is used. However, as the nitrogen gas, N radical (hereinafter, expressed by N*) or $N_2$ radical (hereinafter, expressed by $N_2$*) may be used. Further, as the $NH_3$ gas, $NH_3$ gas diluted with $N_2$ or noble gas may be used. Furthermore, other material including nitrogen atoms may be used in place of $NH_3$, N*, or $N_2$*.

The kind of gas and heat treatment time in step S24 can be combined variously. For example, in step S24, air pressure is set to 740 Torr, the heat treatment time is set to 100 seconds. However, the silicon substrate 10 may be heat treated under air pressure of 740 Torr for time other than 100 seconds. The air pressure and the heat treatment time can be combined variously according to heat treatment temperature.

It is possible that the embodiment also has the advantages of the first to fourth embodiments by being combined with the first to fourth embodiments.

SIXTH EMBODIMENT

Figure 21:
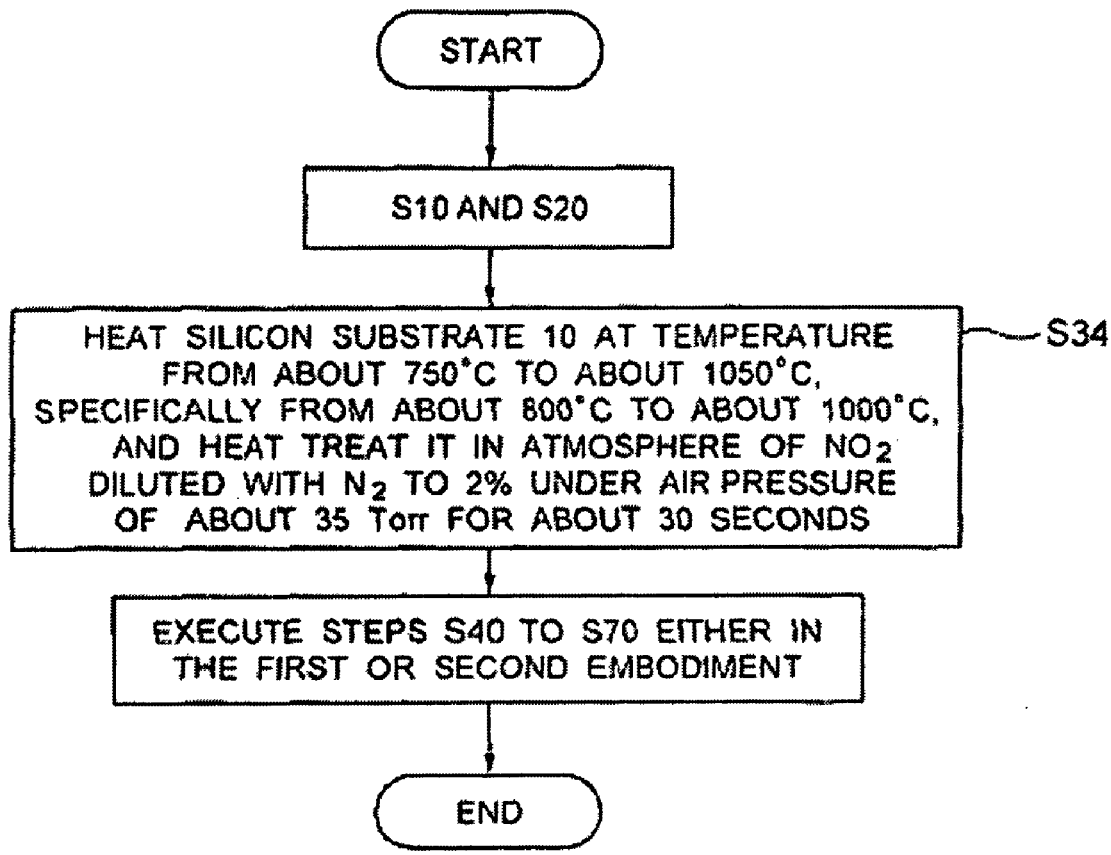
FIG. 21 is a flowchart showing a semiconductor device manufacturing method according to a sixth embodiment of the invention in the order of the processes.

FIG. 21 is a flowchart showing a semiconductor device manufacturing method according to the sixth embodiment of the invention in the order of the processes. The sectional flow views shown by the sections of the semiconductor substrate will be omitted because they are the same as FIGS. 2 to 5. The embodiment is different from the first to fifth embodiments in the point where step S34 in which heat treatment temperature is limited is included in place of step S30.

First, the steps S10 and S20 shown in FIG. 1 are executed. The physical thickness of the silicon nitride film 20 is about 1.0 nm. Then, the silicon substrate 10 is heated at temperature from about 750° C. to about 1050° C., specifically from about 800° C. to about 1000° C., and heat treated in an atmosphere of $NO_2$ diluted with $N_2$ to 2% under air pressure of about 35 Torr for about 30 seconds (S34). Further, steps S40 to S70 are executed. The steps S40 to S70 may be the same as those in any one of the first to fifth embodiments.

Figure 22:
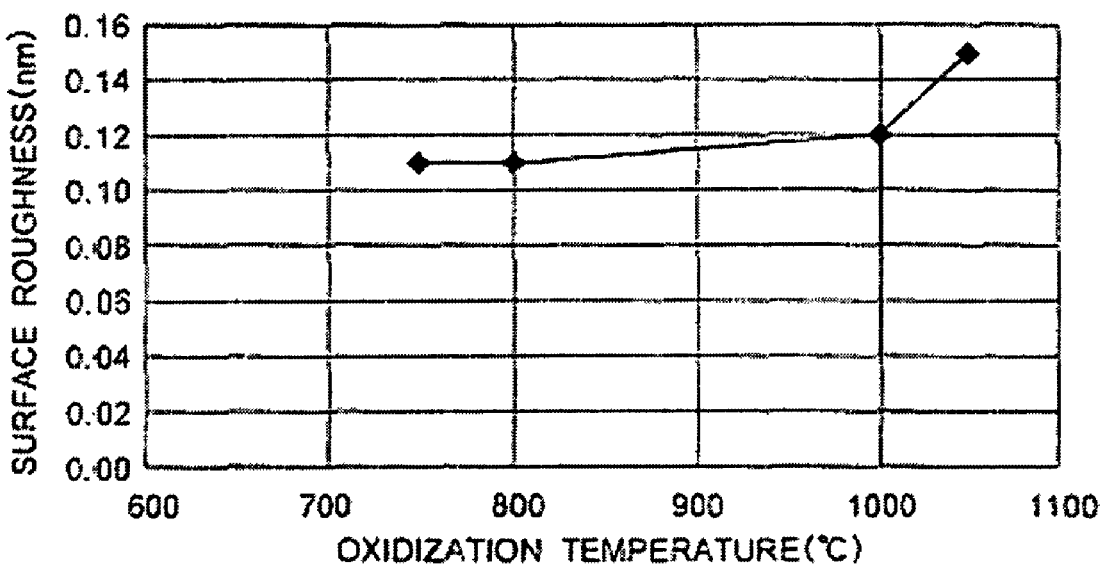
FIG. 22 is a graph showing the relationship between the heat treatment temperature in step S34 and the surface roughness of the ONO film 41.
Figure 23:
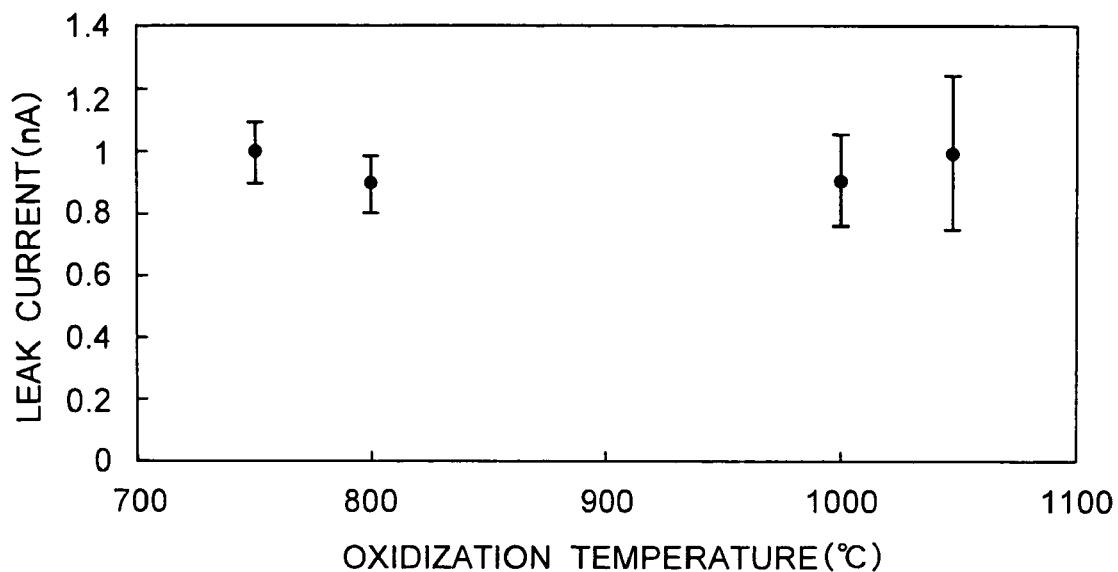
FIG. 23 is a graph showing the relationship between the heat treatment temperature in step S34 and the leak current of the ONO film 41.
Figure 24:
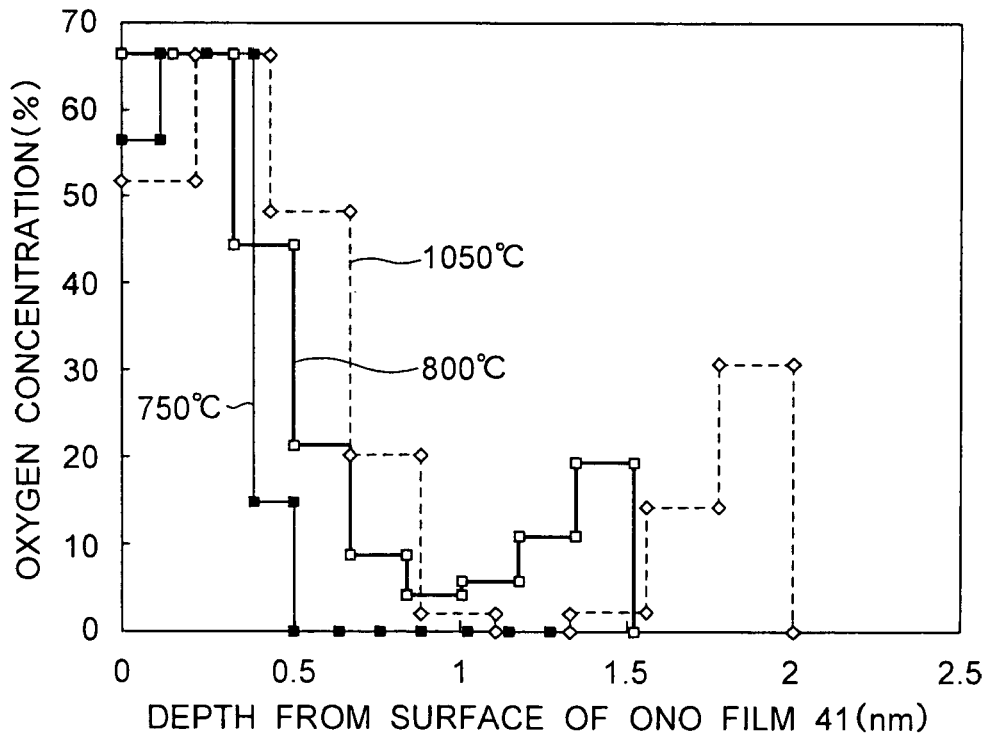
FIG. 24 is a graph showing oxygen concentration of the ONO film 41 with respect to each heat treatment temperature in step S34.

Referring to FIGS. 22 to 24, an advantage of the embodiment will be described.

FIG. 22 is a graph showing the relationship between the heat treatment temperature in step S34 and the surface roughness of the ONO film 41 (see FIG. 4). The surface roughness becomes low when the heat treatment temperature in step S34 is less than about 1050° C.

FIG. 23 is a graph showing the relationship between the heat treatment temperature in step S34 and the leak current of the ONO film 41. The leak current of the ONO film 41 is observed using a conductive AFM. The vertical axis of the graph indicates the current value flowing in the ONO film 41 when 10 MV/cm is applied to the ONO film 41 between the AFM chip and the silicon substrate 10. The leak current varies relatively slightly when the heat treatment temperature in step S34 is less than about 1050° C. This is because uniformity of the silicon nitride film 20 is deteriorated due to change in structure of the silicon nitride film 20 when the heat treatment temperature is equal to or more than about 1050° C.

Furthermore, the leak current becomes the minimum from about 800° C. to about 1000° C. Therefore, the heat treatment temperature in step S34 is preferably less than about 1050° C. in light of surface roughness and leak current of the ONO film 41, specifically preferably from about 800° C. to about 1000° C.

FIG. 24 is a graph showing oxygen concentration of the ONO film 41 with respect to each heat treatment temperature in step S34. The horizontal axis indicates depth from the surface of the ONO film 41, and the vertical direction indicates oxygen concentration. The surface of the ONO film 41 is 0 nm, and the silicon oxide film 40, the silicon nitride film 20, and the silicon oxide film 30 are sequentially provided from the surface toward the depth direction (see FIG. 4). The interface between the silicon nitride film 20 and the silicon substrate 10 or the silicon oxide film 30 exists in the position at the depth from about 1 nm to about 2 nm from the surface of the ONO film 41.

In the case where the heat treatment temperature in step S34 is about 750° C., due to poor oxidative power, only the surface of the ONO film 41 has been oxidized, and oxygen has not reached the interface between the silicon nitride film 20 and the silicon substrate 10. That is, the silicon oxide film 30 has not been formed.

In the case where the heat treatment temperature in step S34 is about 1050° C., oxygen has reached the interface between the silicon nitride film 20 and the silicon substrate 10 and the silicon oxide film 30 has been formed. However, the thicknesses of the silicon oxide films 30 and 40 become excessively thick, and the EOT of the gate insulative film 70 rises.

By contrast, in the case where the heat treatment temperature in step S34 is about 800° C., oxygen has reached the interface between the silicon nitride film 20 and the silicon substrate 10 and the silicon oxide film 30 has been formed. Further, the thicknesses of the silicon oxide films 30 and 40 are relatively thin. Accordingly, the gate insulative film 70 having a low EOT can be formed.

From the graphs shown in FIG. 22 to 24, it is seen that the heat treatment temperature in step S34 is preferably from about 750° C. to 1050° C., specifically preferably from about 800° C. to about 1000° C.

In step S34 of the embodiment, $N_2O$ diluted with $N_2$ to 2% is used. However, as long as the silicon oxide film 30 having an uniform thickness is formed at an interface, that is, as long as the interfacial oxidative reaction occurs between the silicon substrate 10 and the silicon nitride film 20, other gas including oxygen may be used. Further, in the embodiment, $N_2$ is used as a dilution gas of $N_2O$, however, noble gas may be used as the dilution gas. Furthermore, $N_2O$ may be used without being diluted.

In step S34 of the embodiment, as long as the silicon oxide films 30 and 40 having uniform thicknesses are formed, the air pressure and the heat treatment time can be combined variously according to heat treatment temperature.

In the embodiment, in place of step S20, step S24 may be included as in the fifth embodiment. Thereby, it is possible that the embodiment also has the same effect as that of the fifth embodiment. In addition, it is possible that the embodiment also has the effects of the first to fourth embodiments by being combined with the first to fourth embodiments.

SEVENTH EMBODIMENT

Figure 25:
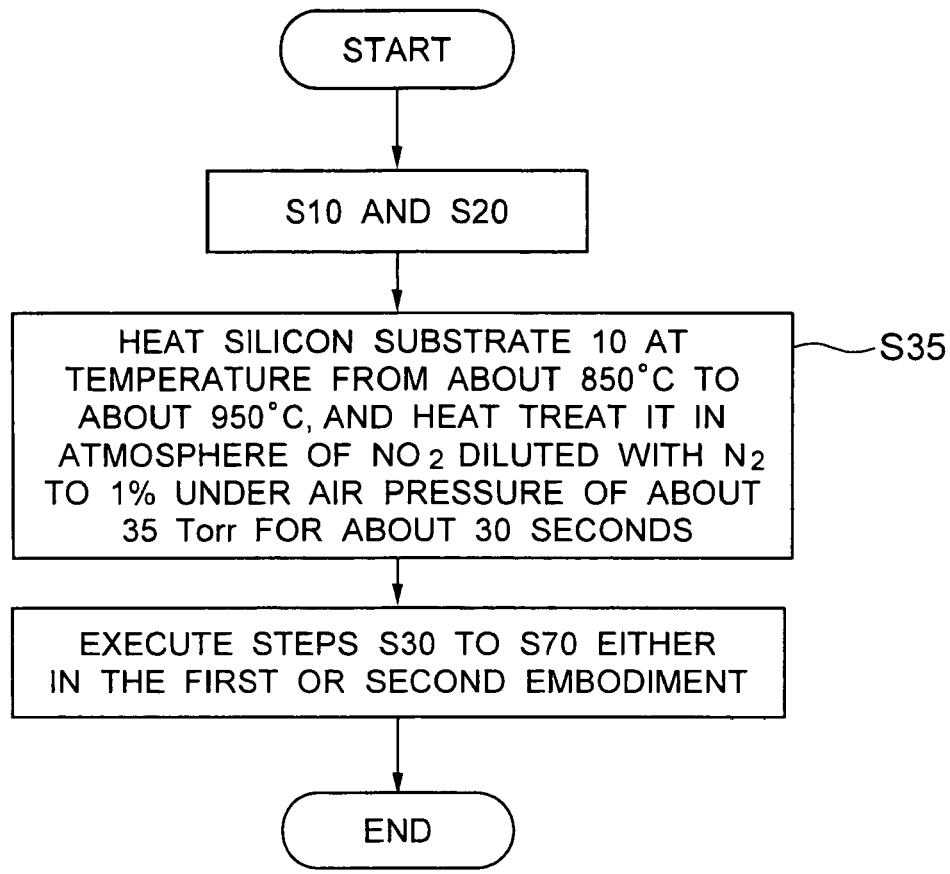
FIG. 25 is a flowchart showing a semiconductor device manufacturing method according to a seventh embodiment of the invention in the order of the processes.

FIG. 25 is a flowchart showing a semiconductor device manufacturing method according to the seventh embodiment of the invention in the order of the processes. The sectional flow views shown by the sections of the semiconductor substrate will be omitted because they are the same as FIGS. 2 to 5. The embodiment is different from the sixth embodiment in the point where step S35 in which heat treatment temperature is further limited and $O_2$ diluted with $N_2$ to 1% is used is included in place of step S34.

First, the steps S10 and S20 shown in FIG. 1 are executed. The physical thickness of the silicon nitride film 20 is about 1.0 nm. Then, the silicon substrate 10 is heated at temperature from about 850° C. to about 950° C., and heat treated in an atmosphere of $NO_2$ diluted with $N_2$ to 1% under air pressure of about 35 Torr for about 30 seconds (S35). Further, steps S40 to S70 are executed. The steps S40 to S70 may be the same as those in any one of the first to sixth embodiments.

Figure 26:
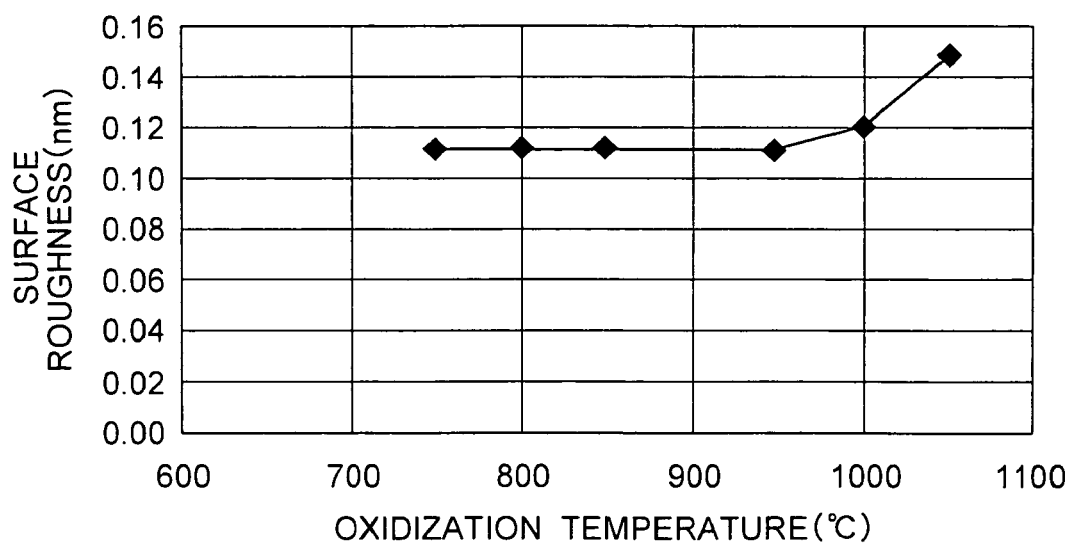
FIG. 26 is a graph showing the relationship between the heat treatment temperature in step S35 and the surface roughness of the ONO film 41.
Figure 27:
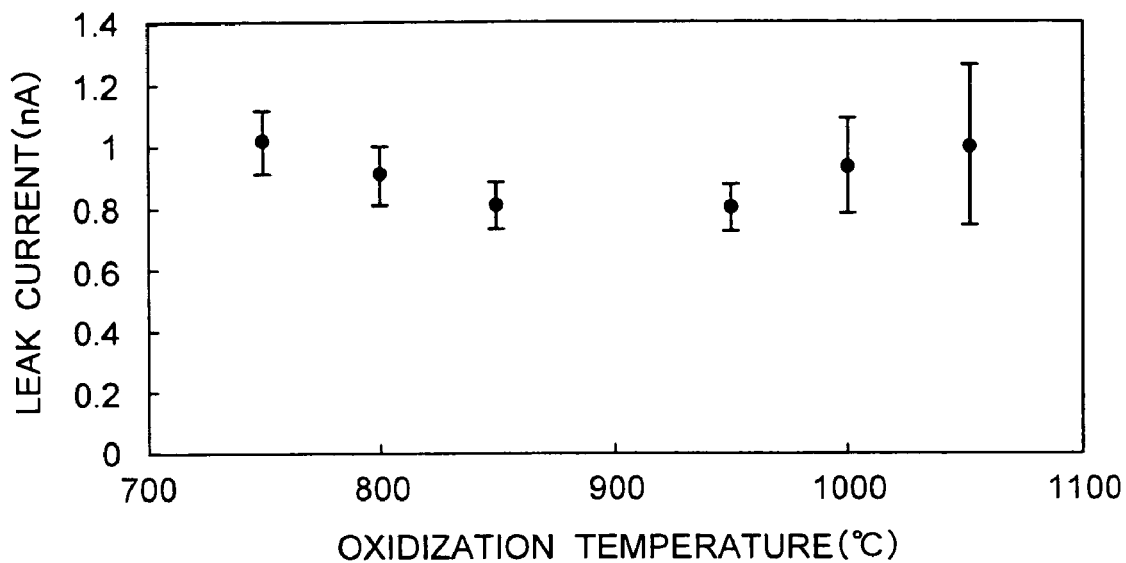
FIG. 27 is a graph showing the relationship between the heat treatment temperature in step S35 and the leak current of the ONO film 41.
Figure 28:
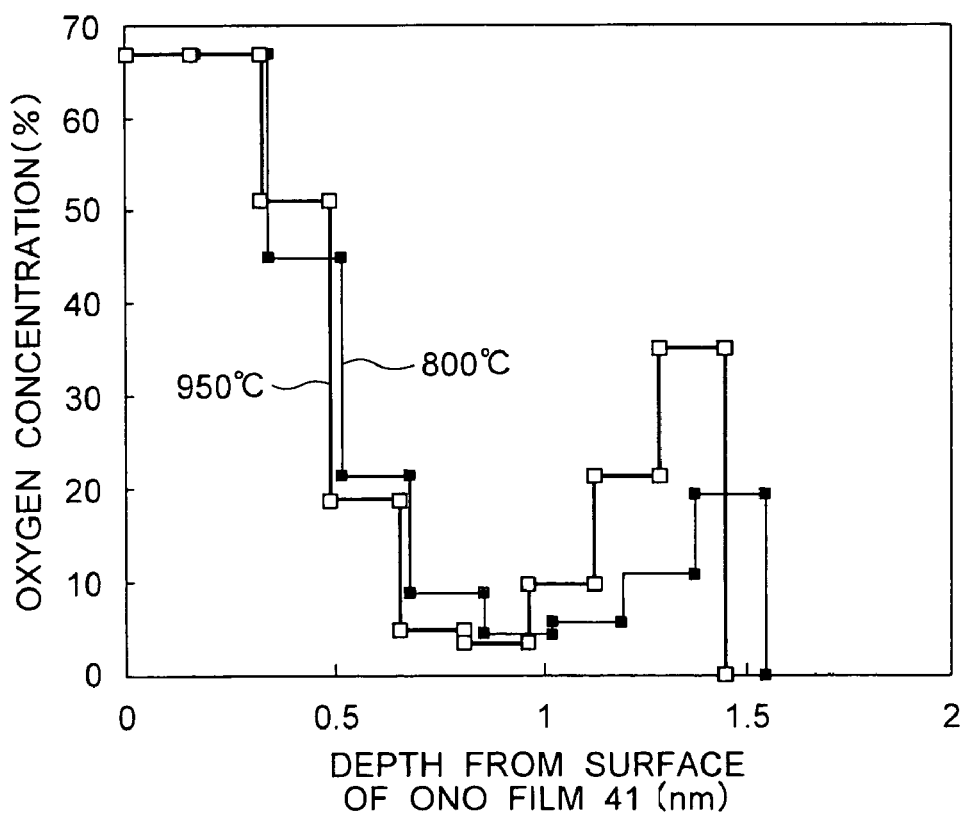
FIG. 28 is a graph showing oxygen concentration of the ONO film 41 with respect to each heat treatment temperature in step S35.

Referring to FIGS. 26 to 28, an advantage of the embodiment will be described.

FIG. 26 is a graph showing the relationship between the heat treatment temperature in step S35 and the surface roughness of the ONO film 41 (see FIG. 4). The surface roughness is low when the heat treatment temperature in step S35 is equal to or less than about 950° C.

FIG. 27 is a graph showing the relationship between the heat treatment temperature in step S35 and the leak current of the ONO film 41. The leak current of the ONO film 41 is observed using a conductive AFM. The vertical axis of the graph indicates the current value flowing in the ONO film 41 when 10 MV/cm is applied to the ONO film 41 between the AFM chip and the silicon substrate 10. The leak current varies relatively slightly when the heat treatment temperature in step S35 is equal to or less than about 950° C.

Furthermore, the leak current becomes the minimum at from about 850° C. to about 950° C. Therefore, the heat treatment temperature in step S35 is preferably from about 850° C. to about 950° C.

FIG. 28 is a graph showing oxygen concentration of the ONO film 41 with respect to each heat treatment temperature in step S35. The horizontal axis indicates depth from the surface of the ONO film 41, and the vertical direction indicates oxygen concentration. The surface of the ONO film 41 is 0 nm, and the silicon oxide film 40, the silicon nitride film 20, and the silicon oxide film 30 are sequentially provided from the surface toward the depth direction (see FIG. 4). The silicon oxide film 30 exists in the vicinity of the position at the depth from about 1 nm to about 1.5 nm from the surface of the ONO film 41.

In the case where the heat treatment temperature in step S35 is about 800° C., the rate of rise (rate of change) of oxygen concentration within the silicon oxide film 30 is low, and the oxygen concentration of the silicon oxide film 30 is low. The oxygen concentration at this time is about 20%. The EOT of the ONO film 41 is about 1.0 nm.

On the other hand, in the case where the heat treatment temperature in step S35 is about 950° C., the rate of rise (rate of change) of oxygen concentration within the silicon oxide film 30 is high, and the oxygen concentration of the silicon oxide film 30 is high. The oxygen concentration at this time reaches about 34%. The EOT of the ONO film 41 is about 0.9 nm.

Thus, in the case where the heat treatment temperature is about 950° C., the rate of change of oxygen concentration within the silicon oxide film 30 is larger and the thickness of the silicon oxide film 30 is thinner than in the case where it is about 800° C. Thereby, in the case where the heat treatment temperature is about 950° C., the dielectric constant and EOT of the ONO film 41 is suppressed at lower level than in the case where it is about 800° C. As a result, it is seen that the heat treatment temperature in step S35 is more preferably at about 950° C. than about 800° C.

From the result in FIG. 28, it is conceivable that the leak current becomes low when the heat treatment temperature in step S35 is from about 800° C. to about 950° C. because the oxygen amount supplied to the interface between the silicon nitride film 20 and the silicon substrate 10 increases and the band gap becomes larger. Therefore, the heat treatment temperature in step S35 is preferably from about 850° C. to about 950° C.

In step S35 of the embodiment, $O_2$ is used as oxygen gas, however, as long as the interfacial oxidative reaction occurs, other gas including oxygen may be used. Further, diluted $O_2$ is used as oxygen gas, however, undiluted $O_2$ may be used. Furthermore, $N_2$ is used as a dilution gas, however, noble gas may be used in place of $N_2$.

In step S35 of the embodiment, as long as the silicon oxide films 30 and 40 having uniform thicknesses are formed, the air pressure and the heat treatment time can be combined variously according to heat treatment temperature.

In the embodiment, in place of step S20, step S24 may be included as in the fifth embodiment. Thereby, it is possible that the embodiment also has the same effect as that of the fifth embodiment. In addition, it is possible that the embodiment also has the effects of the first to fourth embodiments by being combined with the first to fourth embodiments.

The gate insulative film 70 formed in the above described embodiments may be used as a buffer film of a high-K film. In this case, the high-K film is formed on the insulative film 60, and this multilayer film serves as a gate insulative film. In this case, the gate insulative film 70 can suppress the interfacial reaction between the high-K film and the silicon substrate 10.

EIGHTH EMBODIMENT

Figure 29:
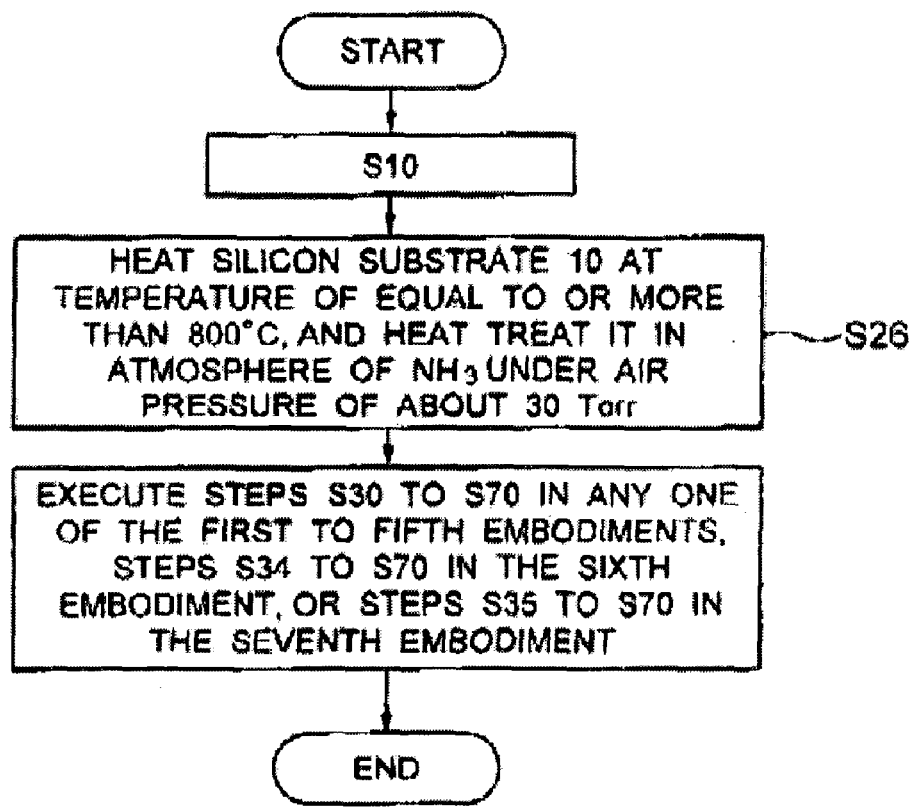
FIG. 29 is a flowchart showing a semiconductor device manufacturing method according to a eighth embodiment of the invention in the order of the processes.

FIG. 29 is a flowchart showing a semiconductor device manufacturing method according to the eighth embodiment of the invention in the order of the processes. The sectional flow views shown by the sections of the semiconductor substrate will be omitted because they are the same as FIGS. 2 to 5. The embodiment is different from the first to seventh embodiments in air pressure and temperature at the time of heat treatment in step S20 shown in FIG. 1 or S24 shown in FIG. 17.

First, the step S10 shown in FIG. 1 is executed. Then, the silicon substrate 10 is heated at temperature of equal to or more than 800° C., and heat treated in an atmosphere of $NH_3$ under air pressure equal to or less than 30 Torr (S26). Thereby, as shown in FIG. 2, the silicon nitride film 20 is formed on the silicon substrate 10. Then, steps S30 to S70 in any one of the first to fifth embodiments, steps S34 to S70 in the sixth embodiment, or steps S35 to S70 in the seventh embodiment are executed.

Figure 30:
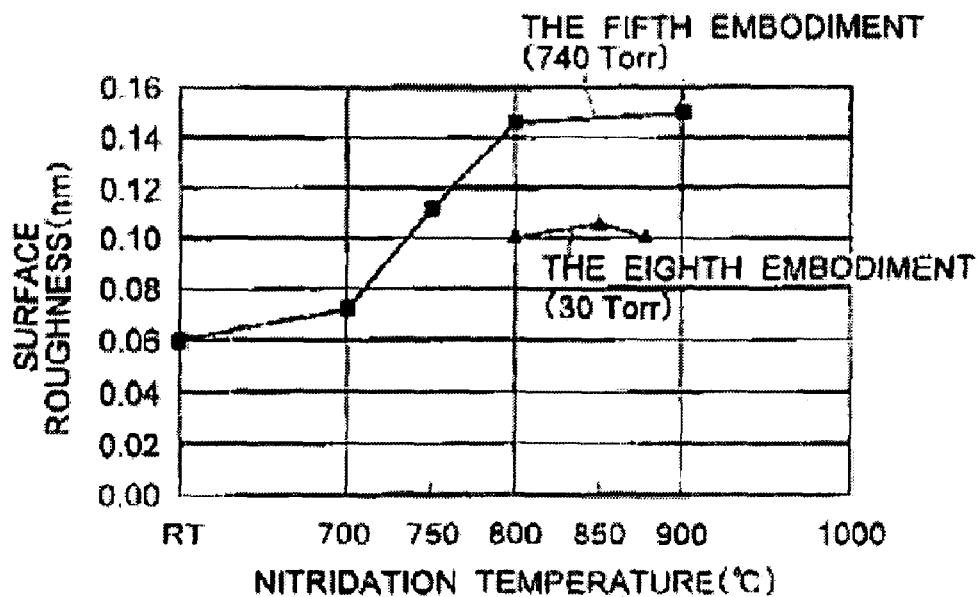
FIG. 30 is a graph showing the relationship between the heat treatment temperature in step S26 and the surface roughness of the silicon nitride film 20.

FIG. 30 is a graph showing the relationship between the heat treatment temperature in step S26 and the surface roughness of the silicon nitride film 20. In the graph, the dashed line shows characteristics of the silicon nitride film 20 formed according to the fifth embodiment shown in FIG. 18. The solid line shows characteristics of the silicon nitride film 20 formed in step S26 in the eighth embodiment by heating the silicon substrate 10 at temperature of 800° C. to 875° C. and heat treating it under air pressure of 30 Torr. As clearly seen by comparison in the graph, when the air pressure at the time of heat treatment is reduced to 30 Torr, even if the heat treatment temperature is equal to or more than 800° C., the surface roughness of the silicon nitride film 20 is as low as 0.10 to 0.11 nm.

Figure 31:
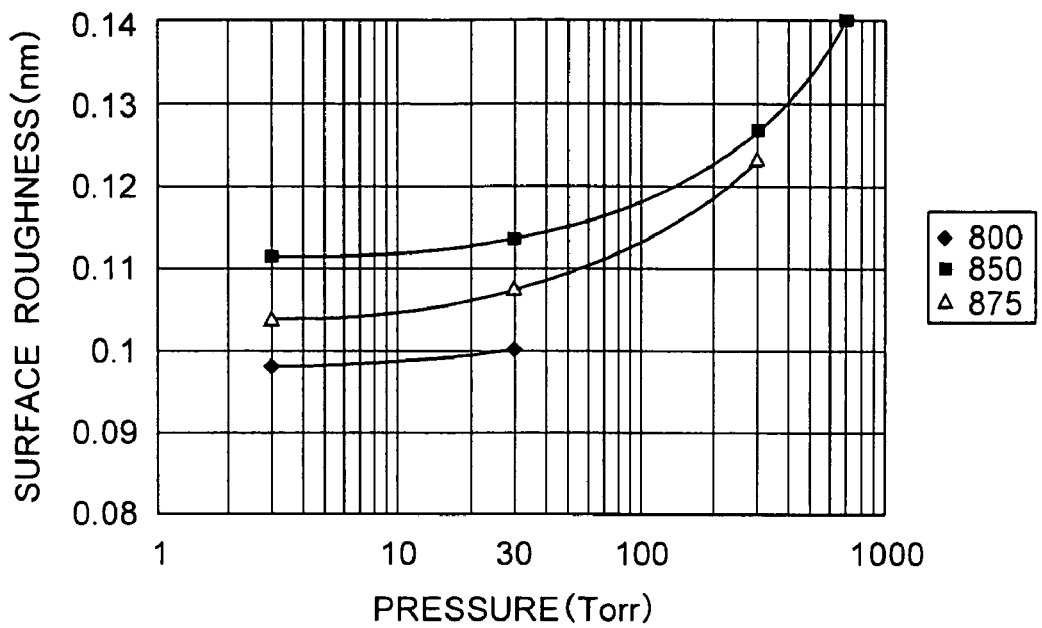
FIG. 31 is a graph showing the relationship between the air pressure at the time of heat treatment in step S26 and the surface roughness of the silicon nitride film 20.

FIG. 31 is a graph showing the relationship between the heat treatment temperature in step S26 and the surface roughness of the silicon nitride film 20. When the air pressure at the time of heat treatment is equal to or less than 30 Torr, even if the heat treatment temperature is equal to or more than 800° C., the low surface roughness of the silicon nitride film 20 is maintained.

It is preferred that the heat treatment temperature in the step for forming the silicon nitride film 20 is lower than 800° C. in light of surface roughness and leak current (see FIGS. 18 and 19), however, higher than 800° C. in light of three coordination structure (N—$Si_3$) (see FIG. 20). Therefore, surface roughness and three coordination structure are in trade-off relationship.

The eighth embodiment can suppress the surface roughness of the silicon nitride film 20 at lower level even at the heat treatment temperature of equal to or more than 800° C., and thereby, solve the trade-off relationship relating to surface roughness and three coordination structure.

Figure 32:
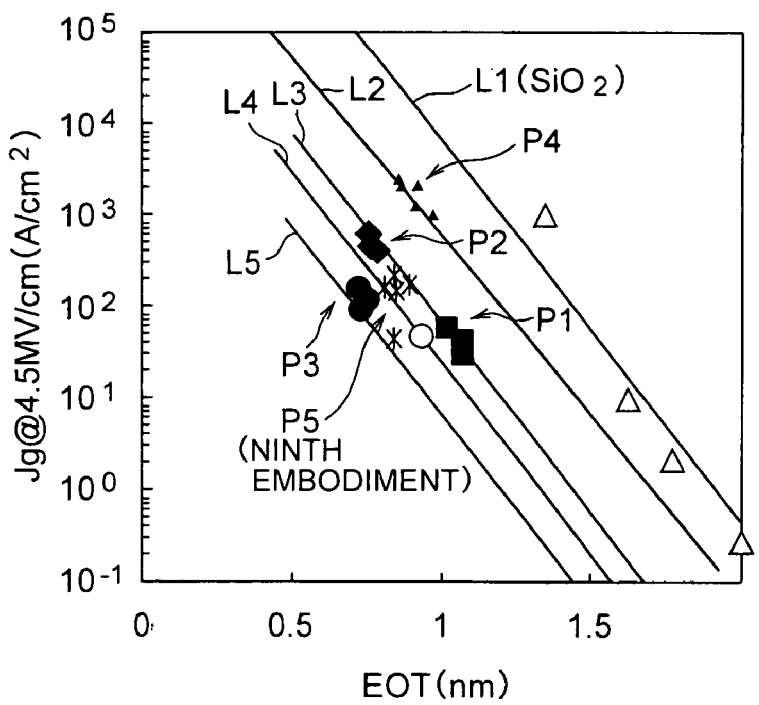
FIG. 32 is a graph showing EOT and gate leak current Jg.
Figure 33A:
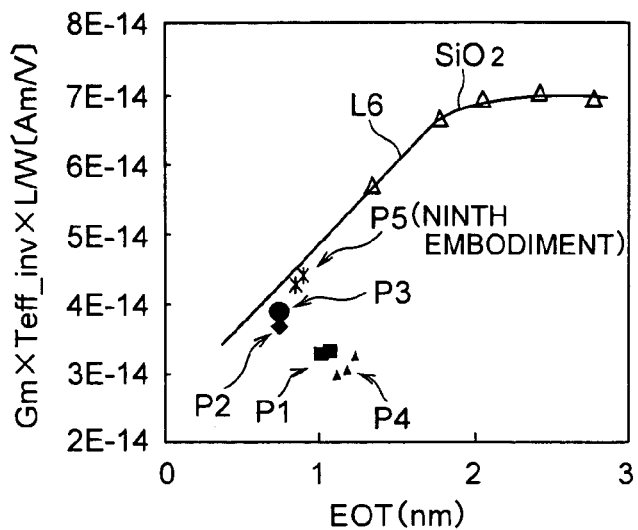
FIG. 33A is a graph showing the relationship between EOT and transconductance Gm.
Figure 33B:
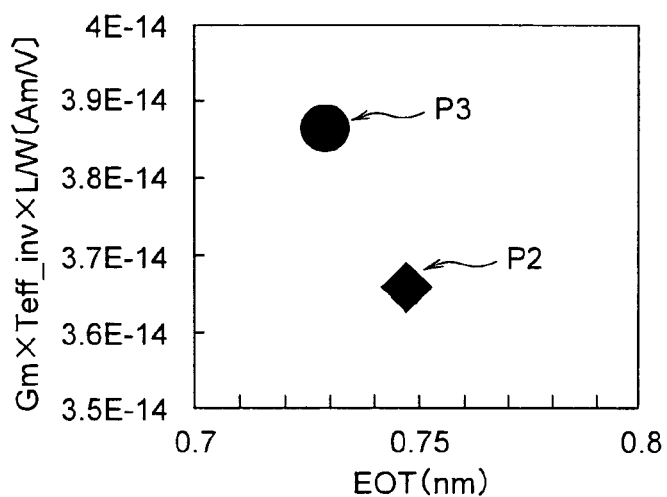
FIG. 33B is a graph enlarged a part of FIG. 33A.
Figure 33C:
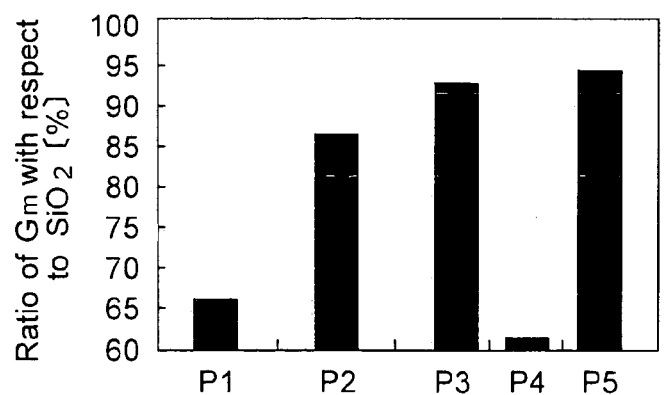
FIG. 33C is a graph showing a ratio of a transconductance Gm of the each gate insulating layer to a gate insulating layer made of silicon oxide as a reference.

Thus, by improving both of surface roughness and three coordination structure, the eighth embodiment has characteristics shown in FIGS. 32 to 33C.

FIG. 32 is a graph showing EOT and gate leak current Jg. The leak current Jg is the current value ($A/cm^2$) leaking via the gate insulative film 70 when 4.5 MV/cm is applied to the gate electrode. The line L1 shows the characteristics of the gate insulative film consisting of a conventional silicon oxide film. The line L2 shows the characteristics of the gate insulative film consisting of a conventional silicon nitride film. The lines L3 and L4 show the characteristics of the gate insulative film 70 according to any one of the first to seventh embodiments. The line L5 shows the characteristics of the gate insulative film according to the eighth embodiment.

As shown by the line L1, in the gate insulative film consisting of a conventional silicon oxide film, the EOT can not be reduced sufficiently. Further, when the EOT is reduced, in the gate insulative film consisting of the silicon oxide film, the leak current Jg becomes very large.

As shown by the line L2, in the gate insulative film consisting of a conventional silicon nitride film, the EOT can be reduced more greatly than the gate insulative film consisting of the silicon oxide film, however, when the EOT is reduced, the leak current Jg still becomes large.

The plot group P1 on the lines L3 and L4 shows the characteristics of the gate insulative film having a smaller number of three coordination structures and smaller surface roughness, and the plot group P2 shows the characteristics of the gate insulative film having a larger number of three coordination structures and larger surface roughness.

In the plot group P1, since the leak current Jg is lower, but the three coordination structures are smaller and dangling bonds are larger in number, oxygen concentration becomes higher in the silicon nitride film 20 and the EOT is difficult to be reduced to equal to or less than 0.8. On the other hand, in the plot group P2, since the three coordination structures are larger and dangling bonds are smaller in number, but the surface roughness is larger, the leak current Jg becomes larger. The gate insulative film 70 exhibiting the best characteristics in the plot groups P1 and P2 has EOT of about 0.9 and Jg of about 54 $A/cm^2$ (see the line L4).

The gate insulative film 70 according to the eighth embodiment shown by the line L5 has EOT of about 0.73 and Jg of about 88 $A/cm^2$. The eighth embodiment has a larger number of three coordination structures and smaller surface roughness, and thus, while realizing very low EOT, the leak current Jg can also be reduced. Note that, if the EOT of about 0.73 is realized in the first to seventh embodiments, Jg becomes as high as 200 to 800 $A/cm^2$.

By the way, in M. Kundu et al. "N and Si outdiffusion in $HfAlO_x$/SiN/Si(001) structure during thermal annealing", Jan. 23-24, 2004, in JSAP CARALOG No. AP042202 p111-114 (hereinafter, referred to as "Non-patent Document 2"), a semiconductor device using $HfAlO_x$ and SiN as a gate insulative film is disclosed. This SiN is provided for preventing the diffusion of Hf to the silicon substrate and formation of the silicate having low dielectric constant. According to the document, SiN is formed by heat treating the silicon substrate at temperature of 850° C. in an atmosphere of $NH_3$ under air pressure of 30 Torr. Further, the device using the gate insulative film consisting of $HfAlO_x$ and SiN has characteristics substantially along the line L3 in FIG. 32. That is, conventionally, there has been a general conception that the gate insulative film consisting of $HfAlO_x$ and SiN is more advantageous than the gate insulative film consisting of the silicon nitride film (see the line L2) in characteristics.

However, the embodiment according to the invention enables manufacture of a device having characteristics equal to or more advantageous than the device using the gate insulative film consisting of $HfAlO_x$ while adopting the gate insulative film consisting of the silicon nitride film without using metal. That is, the embodiment according to the invention brings result that disproves the above described general conception. Further, the embodiment according to the invention does not use metal for the gate insulative film, and thereby, heat treatment at high temperature can be performed after formation of the gate insulative film.

FIGS. 33A and 33B are graphs showing the relationship between EOT and transconductance Gm. The transconductance Gm is an amount of current flowing between the source and drain when a voltage is applied to the gate electrode and drain electrode and the device is turned on.

As shown by the line L6, generally, the gate insulative film consisting of the silicon oxide film is relatively small in work function difference from the silicon substrate and exhibits good transconductance Gm. By contrast, the gate insulative film 70 including the silicon nitride film is relatively larger in work function difference from the silicon substrate compared to the gate insulative film consisting the silicon oxide film and transconductance Gm becomes deteriorated.

The gate insulative film most like the gate insulative film consisting of the silicon oxide film among the plot groups P1 to P4 is the gate insulative film according to the eighth embodiment (plot group P3).

FIG. 33C shows the ratio of transconductance Gm of the respective gate insulative films with the gate insulative film consisting of the silicon oxide film as reference. In the case where the transconductance Gm of the device using the gate insulative film consisting of the silicon oxide film is assumed as 100%, the plot group P1 is 65% and the plot group P2 is 87%. Further, the plot group P3 according to the eighth embodiment is nearly 92%. Thus, the eighth embodiment can realize the transconductance Gm comparable to the gate insulative film consisting of the silicon oxide film.

NINTH EMBODIMENT

Figure 34:
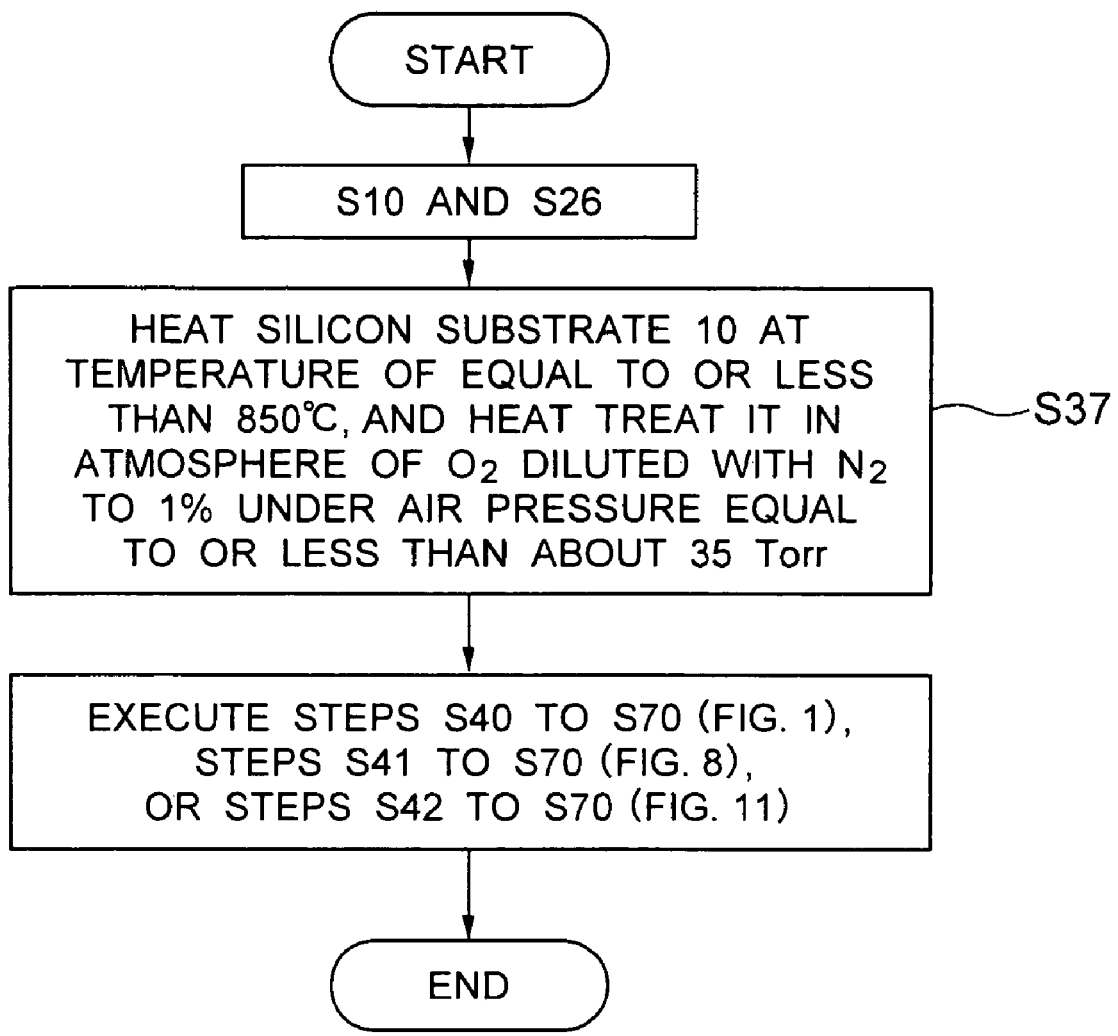
FIG. 34 is a flowchart showing a semiconductor device manufacturing method according to a ninth embodiment of the invention in the order of the processes.

FIG. 34 is a flowchart showing a semiconductor device manufacturing method according to the ninth embodiment of the invention in the order of the processes. The sectional flow views shown by the sections of the semiconductor substrate will be omitted because they are the same as FIGS. 2 to 5. The embodiment is different from the eighth embodiment in air pressure and temperature at the time of oxidization treatment in step S30.

First, the steps S10 and S26 shown in FIG. 29 are executed. Then, the silicon substrate 10 is heated at temperature of equal to or less than 850° C., and heat treated in an atmosphere of $O_2$ diluted with $N_2$ to 1% under air pressure of equal to or less than 35 Torr (S37). Then, steps S40 to S70 (FIG. 1), steps S41 to S70 (FIG. 8), or steps S42 to S70 (FIG. 11) are executed.

Figure 35:
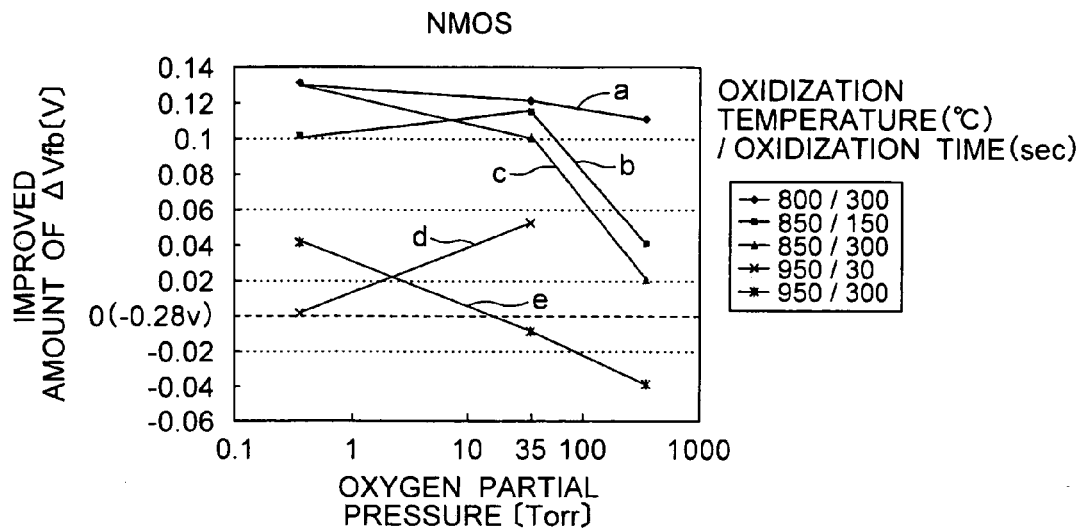
FIG. 35 is a graph of an NMOS showing the relationship between oxygen partial pressure in step 37 and improved amount of flat band voltage $\Delta Vfb$.
Figure 36:
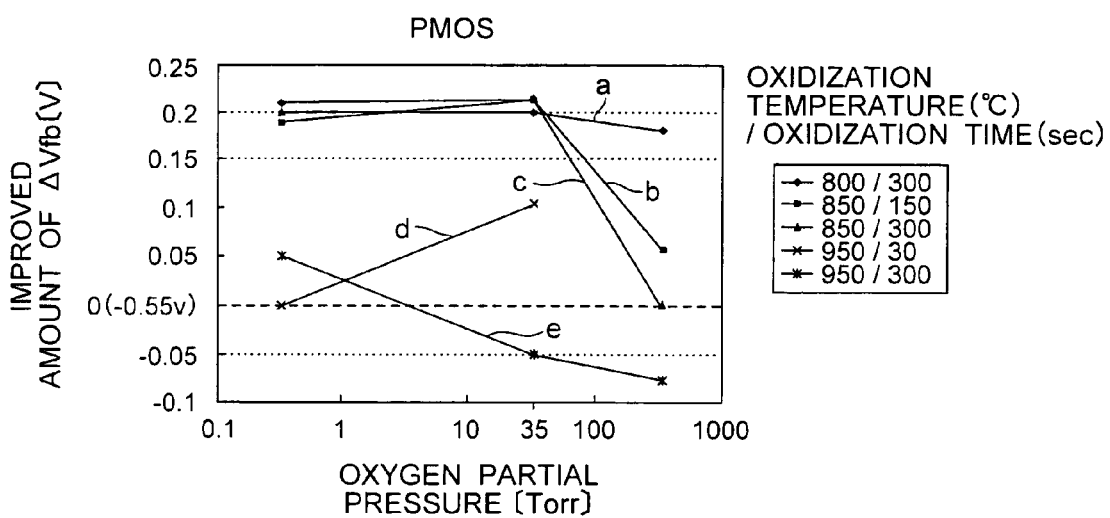
FIG. 36 a graph of a PMOS showing the relationship between oxygen partial pressure in step 37 and improved amount of flat band voltage $\Delta Vfb$.

FIGS. 35 and 36 are graphs showing the relationship between oxygen partial pressure in step 37 and improved amount of flat band voltage ΔVfb. FIG. 35 is a graph of an NMOS, and FIG. 36 is a graph of a PMOS. The improved amount of ΔVfb of the vertical axis uses ΔVfb when the silicon oxide film is used for the gate insulative film as reference, and ΔVfb=−0.28 V for the NMOS and ΔVfb=−0.55 V for the PMOS as original (zero) points.

Oxidization temperature/oxidization time with respect to lines a, b, c, d, and e are 800° C./300 sec, 850° C./150 sec, 850° C./300 sec, 950° C./30 sec, and 950° C./300 sec, respectively.

As shown in these graphs, in conditions that the oxygen partial pressure is equal to or less than 35 Torr and the oxidization temperature is equal to or less than 850° C., the improved amount of ΔVfb becomes larger. The actual ΔVfb in these conditions are −0.15 V in the NMOS and −0.35 V in the PMOS.

Here, low temperature oxidization at equal to or less than 850° C. is performed, there is concern about increase in leak current Jg as shown in FIG. 27. However, the gate insulative film according to the ninth embodiment has leak current Jg reduced more than double digits compared to the gate insulative film consisting of the silicon oxide film as the plot group P5 shown in FIG. 32. This is because the same step S26 as in the eighth embodiment is executed to form a good quality silicon nitride film before step S37. Thus, by forming the good quality silicon nitride film in step S26, low temperature oxidization in step S37 can be performed. As a result, the ninth embodiment can improve ΔVfb of both the NMOS and the PMOS while reducing the leak current.

Further, with respect to transconductance Gm, as shown in FIG. 33C, the plot group P5 indicates the value of 92% to 95%. That is, the ninth embodiment can realize the transconductance Gm comparable to the gate insulative film consisting of the silicon oxide film.

As described in the ninth embodiment, the reason for improving ΔVfb and Gm while reducing leak current Jg by performing low temperature and low pressure oxidization in step S37 is that, in the low temperature and low pressure oxidization, the surface of the silicon nitride film 20 becomes difficult to be oxidized due to decrease in the oxidative power and the interface between the silicon nitride film and the silicon substrate becomes oxidized by priority. That is, the reason is that the thickness of the silicon oxide film 40 becomes thinner and the thickness of the silicon oxide film 30 becomes thicker.

Note that the invention is not limited to the above described embodiments without change, component elements can be modified and embodied within a range not departing the content thereof in the practical phase. Further, various inventions can be formed by suitable combination of plural component elements disclosed in the above described embodiments. For example, some component elements may be deleted from all of the component elements shown in the embodiments. Furthermore, component elements adopted to different embodiments may be suitably combined.

Other embodiments of the present invention will be apparent to those skilled in the art from consideration of the specification and practice of the invention disclosed herein. It is intended that the specification and example embodiments will be considered as exemplary only, with a true scope and spirit of the invention being indicated by the following.

What is claimed is:

1. A semiconductor device manufacturing method comprising:
   sequentially forming a buffer film on a semiconductor substrate by:
      forming a first nitride film on the substrate;
      forming an oxide film and an $SiO_2$ film, the oxide film being between the substrate and the first nitride film, the $SiO_2$ film being on the first nitride film; and
      nitriding only the $SiO_2$ film without nitriding the oxide film to form, on the first nitride film, one of either:
         a second nitride film, or
         an SiON film;
   forming a dielectric film on the buffer film, the dielectric film having a larger dielectric constant than the silicon oxide film; and
   forming a gate electrode on the dielectric film,
   wherein an equivalent oxide thickness of the buffer film is equal to or less than 1 nm.

2. The semiconductor device manufacturing method according to claim 1, wherein the $SiO_2$ film is nitrided using radical of gas including nitrogen atoms.

3. The semiconductor device manufacturing method according to claim 1, further comprising, after nitriding only the $SiO_2$ film, annealing the semiconductor substrate at a temperature from 900° C. to 1000° C.

4. The semiconductor device manufacturing method according to claim 3, wherein, after nitriding only the $SiO_2$ film, the semiconductor substrate is annealed in an atmosphere including helium (He).

5. The semiconductor device manufacturing method according to claim 1, wherein the first nitride film is formed by annealing the semiconductor substrate in an atmosphere including nitrogen atoms at a temperature less than 800° C.

6. The semiconductor device manufacturing method according to claim 5, wherein the first nitride film is formed by annealing the semiconductor substrate in an atmosphere including at least one kind of $NH_3$, N radical, and $N_2$ radical.

7. The semiconductor device manufacturing method according to claim 1, wherein the first nitride film is formed by annealing the semiconductor substrate in an atmosphere including nitrogen atoms at a temperature from 700° C. to 750° C.

8. The semiconductor device manufacturing method according to claim 7, wherein the first nitride film is formed by annealing the semiconductor substrate in an atmosphere including at least one kind of $NH_3$, N radical, and $N_2$ radical.

9. The semiconductor device manufacturing method according to claim 1, wherein the oxide film is formed by thermally oxidizing the semiconductor substrate with oxygen passed through the first nitride film, and the $SiO_2$ film is formed by thermally oxidizing the surface of the first nitride film.

10. The semiconductor device manufacturing method according to claim 9, wherein the oxide film and the $SiO_2$ film are formed by annealing the semiconductor substrate in an atmosphere including oxygen atoms at a temperature less than 1050° C.

11. The semiconductor device manufacturing method according to claim 9, wherein the oxide film and the $SiO_2$ film are formed by annealing the semiconductor substrate in an atmosphere including oxygen atoms at a temperature from 800° C. to 1000° C.

12. The semiconductor device manufacturing method according to claim 9, wherein the oxide film and the $SiO_2$ film are formed by annealing the semiconductor substrate in an atmosphere including oxygen atoms at a temperature from 850° C. to 950° C.

13. The semiconductor device manufacturing method according to claim 9, wherein the oxide film and the $SiO_2$ film are formed by annealing the semiconductor substrate in an atmosphere including $N_2O$ or $O_2$.

14. The semiconductor device manufacturing method according to claim 9, wherein the first nitride film is formed by annealing the semiconductor substrate in an atmosphere including nitrogen atoms under air pressure equal to or less than 30 Torr at a temperature equal to or more than 800° C.

15. The semiconductor device manufacturing method according to claim 9, wherein the oxide film and the $SiO_2$ film are formed by annealing the semiconductor substrate in an atmosphere including oxygen atoms under air pressure equal to or less than 35 Torr at a temperature equal to or less than 850° C.

16. The semiconductor device manufacturing method according to claim 1, wherein the $SiO_2$ film is nitrided by using radical of gas including nitrogen atoms and helium atoms.

17. The semiconductor device manufacturing method according to claim 1, wherein the first nitride film is formed by annealing the semiconductor substrate in an atmosphere including nitrogen atoms under air pressure equal to or less than 30 Torr at a temperature equal to or more than 800° C.

18. The semiconductor device manufacturing method according to claim 17, wherein the oxide film and the $SiO_2$ film are formed by annealing the semiconductor substrate in an atmosphere including oxygen atoms under air pressure equal to or less than 35 Torr at a temperature equal to or less than 850° C.

19. The semiconductor device manufacturing method according to claim 1, wherein the oxide film and the $SiO_2$ film are formed by annealing the semiconductor substrate in an atmosphere including oxygen atoms under air pressure equal to or less than 35 Torr at a temperature equal to or less than 850° C.

20. The semiconductor device manufacturing method according to claim 1, wherein the first nitride film is formed by annealing the semiconductor substrate in an atmosphere including $NH_3$ gas under air pressure equal to or less than 30 Torr.

21. The semiconductor device manufacturing method according to claim 1, wherein the $SiO_2$ film is nitrided in an atmosphere including $N_2$ and using nitrogen radical.

* * * * *